US012740358B2

(12) United States Patent
Chung et al.

(10) Patent No.: US 12,740,358 B2
(45) Date of Patent: Sep. 15, 2026

(54) METHOD OF FINE PITCH PATTERING FOR SEMICONDUCTOR DEVICE AND METHOD OF MANUFACTURING THE SAME

(71) Applicant: SAMSUNG ELECTRONICS CO., LTD., Suwon-si (KR)

(72) Inventors: Sanggyo Chung, Anyang-si (KR); Chanmi Lee, Suwon-si (KR); Hayoung Yi, Hwaseong-si (KR); Kwanghee Cheon, Suwon-si (KR); Seunghee Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 693 days.

(21) Appl. No.: 18/102,897

(22) Filed: Jan. 30, 2023

(65) Prior Publication Data

US 2023/0276611 A1 Aug. 31, 2023

(30) Foreign Application Priority Data

Feb. 3, 2022 (KR) ........................ 10-2022-0014392

(51) Int. Cl.
*H10P 50/00* (2026.01)
*H10B 12/00* (2023.01)
*H10P 76/40* (2026.01)

(52) U.S. Cl.
CPC ........... *H10P 50/695* (2026.01); *H10B 12/09* (2023.02); *H10P 50/71* (2026.01); *H10P 50/73* (2026.01);

(Continued)

(58) Field of Classification Search
CPC ............. H01L 21/3086; H01L 21/0332; H01L 21/0334; H01L 21/0337; H01L 21/31144;

(Continued)

(56) References Cited

U.S. PATENT DOCUMENTS 8,932,955 B1 1/2015 Sel et al.
9,472,414 B2 10/2016 Yang et al.

(Continued)

FOREIGN PATENT DOCUMENTS

CN 110571220 B 9/2021
KR 10-2274837 B1 7/2021

(Continued)

OTHER PUBLICATIONS

First Office Action issued Oct. 13, 2023 for corresponding TW patent application No. 112103665.

(Continued)

*Primary Examiner* — Eliseo Ramos Feliciano
*Assistant Examiner* — Brad A Knudson
(74) *Attorney, Agent, or Firm* — Muir Patent Law, PLLC

(57) ABSTRACT

A method of manufacturing a semiconductor device includes forming a plurality of reference patterns and a peripheral pattern on a feature layer by using a first material such that the peripheral pattern is connected to end portions of the plurality of reference patterns; forming a plurality of first spacers on both sidewalls of each of the plurality of reference patterns by using a second material; removing the plurality of reference patterns; forming a plurality of second spacers on both sidewalls of each of the plurality of first spacers by using the first material; removing the plurality of first spacers so that the plurality of second spacers and the peripheral pattern remain on the feature layer; and patterning the feature layer by using the plurality of second spacers and the peripheral pattern as an etch mask.

18 Claims, 32 Drawing Sheets

(52) U.S. Cl.
CPC .......... *H10P 76/405* (2026.01); *H10P 76/408* (2026.01); *H10P 76/4085* (2026.01); *H10B 12/02* (2023.02); *H10B 12/488* (2023.02)

(58) Field of Classification Search
CPC .......... H01L 21/32139; H01L 21/0338; H10B 12/09; H10B 12/02; H10B 12/488; H10P 50/695; H10P 50/71; H10P 50/73; H10P 76/405; H10P 76/408; H10P 76/4085
See application file for complete search history.

(56) References Cited

U.S. PATENT DOCUMENTS

| | | | | |
|---|---|---|---|---|
| 9,685,332 | B2 | 6/2017 | Chen et al. | |
| 9,755,049 | B2 | 9/2017 | Paak et al. | |
| 9,786,503 | B2 | 10/2017 | Raley et al. | |
| 9,841,672 | B2 | 12/2017 | Kang et al. | |
| 10,170,328 | B1 | 1/2019 | Shih et al. | |
| 10,304,680 | B1 | 5/2019 | Lee et al. | |
| 10,431,470 | B2 | 10/2019 | Sherpa et al. | |
| 10,453,698 | B2 | 10/2019 | Chung et al. | |
| 10,483,119 | B1 | 11/2019 | Pan et al. | |
| 10,510,603 | B2 | 12/2019 | Huang et al. | |
| 10,790,154 | B2 | 9/2020 | Liu et al. | |
| 10,854,503 | B2 | 12/2020 | Sun et al. | |
| 2007/0161251 | A1* | 7/2007 | Tran | H01L 21/0338 257/E21.235 |
| 2008/0008969 | A1* | 1/2008 | Zhou | H01L 21/0338 430/311 |
| 2016/0070848 | A1 | 3/2016 | Kang et al. | |
| 2016/0111297 | A1* | 4/2016 | Chen | H01L 21/0337 438/692 |
| 2016/0211168 | A1 | 7/2016 | Paak et al. | |
| 2016/0218010 | A1 | 7/2016 | Lee et al. | |
| 2019/0198339 | A1* | 6/2019 | Chung | H01L 21/0337 |

FOREIGN PATENT DOCUMENTS

| | | | |
|---|---|---|---|
| KR | 10-2323251 | B1 | 11/2021 |
| TW | 201842574 | A | 12/2018 |
| TW | 201913833 | A | 4/2019 |
| TW | 201913928 | A | 4/2019 |
| TW | 201928514 | A | 7/2019 |
| TW | 202017005 | A | 5/2020 |
| TW | 202013613 | A | 12/2020 |

OTHER PUBLICATIONS

European Search Report dated Jun. 27, 2023, for corresponding EP Patent Application No. 23154788.6.

* cited by examiner

METHOD OF FINE PITCH PATTERING FOR SEMICONDUCTOR DEVICE AND METHOD OF MANUFACTURING THE SAME

CROSS-REFERENCE TO RELATED APPLICATIONS

This application is based on and claims priority under 35 U.S.C. § 119 to Korean Patent Application No. 10-2022-0014392, filed on Feb. 3, 2022, in the Korean Intellectual Property Office, the disclosure of which is incorporated by reference herein in their entirety.

BACKGROUND

1 Field

Embodiments relate to a semiconductor device and a method of manufacturing the same.

2. Description of the Related Art

As semiconductor devices are downscaled, a size of an individual fine circuit pattern for implementing semiconductor devices may be progressively reduced. A photolithography process could have a limitation in resolution, and there could be a limitation in decreasing a pitch of a fine pattern.

SUMMARY

The embodiments may be realized by providing a method of manufacturing a semiconductor device, the method including forming a plurality of reference patterns and a peripheral pattern on a feature layer by using a first material such that the peripheral pattern is connected to end portions of the plurality of reference patterns; forming a plurality of first spacers on both sidewalls of each of the plurality of reference patterns by using a second material; removing the plurality of reference patterns; forming a plurality of second spacers on both sidewalls of each of the plurality of first spacers by using the first material; removing the plurality of first spacers so that the plurality of second spacers and the peripheral pattern remain on the feature layer; and patterning the feature layer by using the plurality of second spacers and the peripheral pattern as an etch mask.

The embodiments may be realized by providing a method of manufacturing a semiconductor device, the method including forming a plurality of reference patterns and a peripheral pattern on a feature layer such that the peripheral pattern is connected to end portions of the plurality of reference patterns; forming a plurality of first spacers on both sidewalls of each of the plurality of reference patterns; removing the plurality of reference patterns; forming a plurality of second spacers on both sidewalls of each of the plurality of first spacers; forming a gap-fill insulation layer on the feature layer such that the gap-fill insulation layer fills a space between the plurality of second spacers; removing the gap-fill insulation layer and the plurality of first spacers such that the plurality of second spacers and the peripheral pattern remain on the feature layer; and patterning the feature layer by using the plurality of second spacers and the peripheral pattern as an etch mask.

The embodiments may be realized by providing a method of manufacturing a semiconductor device, the method including providing a substrate including a cell array region and a boundary region; forming a feature layer on the substrate; forming a plurality of reference patterns and a peripheral pattern on the feature layer by using a first material, the plurality of reference patterns being on the cell array region, and the peripheral pattern being connected to end portions of the plurality of reference patterns and on the boundary region; forming a plurality of first spacers on both sidewalls of each of the plurality of reference patterns by using a second material; removing the plurality of reference patterns; forming a plurality of second spacers on both sidewalls of each of the plurality of first spacers by using the first material; removing the plurality of first spacers such that the plurality of second spacers and the peripheral pattern remain on the feature layer; patterning the feature layer by using the plurality of second spacers and the peripheral pattern as an etch mask; and removing a portion of the substrate by using the feature layer as an etch mask to form a device isolation trench.

The embodiments may be realized by providing a semiconductor device including a substrate including a cell array region and a boundary region; a device isolation trench including a first portion extending in a first direction on the cell array region of the substrate and a second portion connected to the first portion on the boundary region; and a device isolation layer filling the device isolation trench and defining an active region in the substrate, wherein the first portion of the device isolation trench includes a first trench, a second trench, a third trench, and a fourth trench sequentially arranged in a second direction intersecting the first direction, a length of the first trench is greater than a length of the second trench, and a length of the third trench is greater than a length of the fourth trench.

The embodiments may be realized by providing a semiconductor device including a substrate including a cell array region and a boundary region; a plurality of line patterns arranged on the cell array region of the substrate to extend in parallel; and an align key pattern on the boundary region of the substrate, wherein the align key pattern includes a main pattern having a first height; and an edge pattern spaced apart from the main pattern to surround a periphery of the main pattern, the edge pattern having a second height that is the same as the first height.

BRIEF DESCRIPTION OF THE DRAWINGS

Features will be apparent to those of skill in the art by describing in detail exemplary embodiments with reference to the attached drawings in which:

FIGS. 1A to 10B are schematic diagrams illustrating stages in a method of manufacturing a semiconductor device, according to embodiments; In detail, FIGS. 1A, 2A, 3A, 4A, 5A, 6A, 7A, 8, and 9A are horizontal cross-sectional views taken along a line at a first vertical level LV1 of FIG. 1B in process sequence, FIGS. 1B, 2B, 3B, 4B, 5B, 6B, 7B, 9B, and 10B are cross-sectional views taken along line A-A' of FIG. 1A;

FIGS. 11A to 13 are schematic diagrams illustrating stages in a method of manufacturing a semiconductor device, according to embodiments; FIGS. 11A, 12A, and 13 are plan views illustrating stages in a method of manufacturing a semiconductor device in process sequence.

FIGS. 14A to 19B are schematic diagrams illustrating stages in a method of manufacturing a semiconductor device, according to embodiments; and FIGS. 14A and 19A are plan views illustrating stages in a method of manufacturing a semiconductor device in process sequence, and FIGS. 14B, 15 to 18, and 19B are cross-sectional views taken along line C-C' of FIG. 14A.

DETAILED DESCRIPTION

FIGS. 1A to 10B are schematic diagrams illustrating stages in a method of manufacturing a semiconductor device, according to embodiments. In detail, FIGS. 1A, 2A, 3A, 4A, 5A, 6A, 7A, 8, and 9A are horizontal cross-sectional views taken along a line at a first vertical level LV1 of FIG. 1B in process sequence, FIG. 10A is a horizontal cross-sectional view taken along a line at a second vertical level LV2 of FIG. 10B in process sequence, and FIGS. 1B, 2B, 3B, 4B, 5B, 6B, 7B, 9B, and 10B are cross-sectional views taken along line A-A' of FIG. 1A.

Figure 1A:
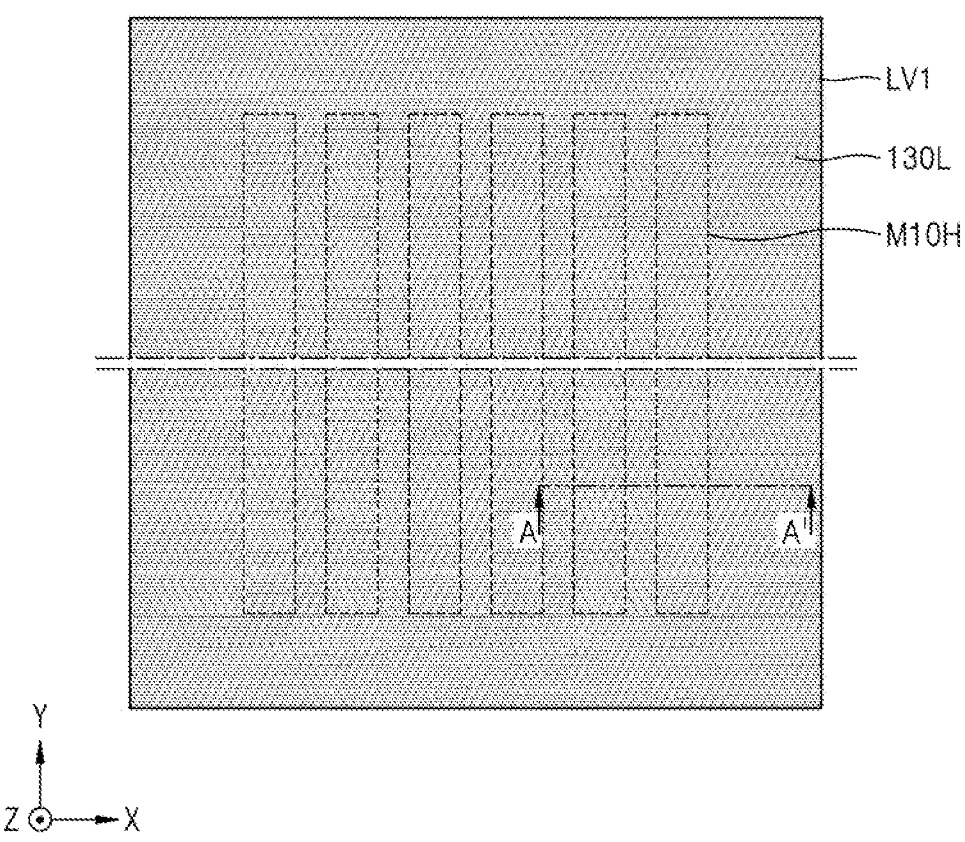
Figure 1B:
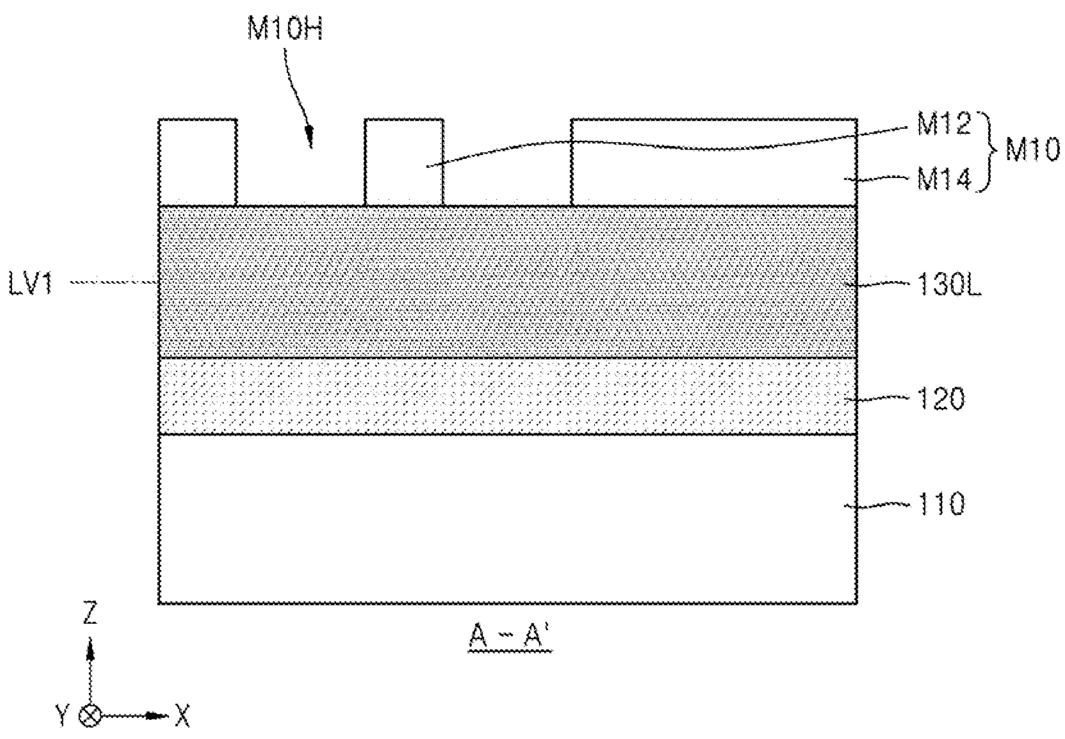

Referring to FIGS. 1A and 1B, a feature layer 120 and a reference pattern layer 130L may be formed on a substrate 110.

In an implementation, the substrate 110 may include silicon, e.g., single crystalline silicon, polycrystalline silicon, or amorphous silicon. In an implementation, the substrate 110 may include, e.g., germanium (Ge), silicon germanium (SiGe), silicon carbide (SiC), gallium arsenide (GaAs), indium arsenide (InAs), or indium phosphide (InP). In an implementation, the substrate 110 may include a conductive region, e.g., an impurity-doped well or an impurity-doped structure. As used herein, the term “or” is not an exclusive term, e.g., “A or B” would include A, B, or A and B.

The feature layer 120 may be a layer to-be-etched, which may be used for forming a plurality of feature patterns 122 (see FIG. 10B) through patterning. The feature layer 120 may include, e.g., silicon oxide, silicon nitride, or polysilicon. The reference pattern layer 130L may include a first material, e.g., the first material may include polysilicon or amorphous silicon.

Subsequently, a first mask pattern M10 may be formed on the reference pattern layer 130L. The first mask pattern M10 may include a plurality of opening portions M10H which extend (e.g., lengthwise) in a second direction Y. The first mask pattern M10 may include a plurality of line patterns M12, which extend in the second direction Y, and a peripheral pattern M14 which are connected to both end portions of the plurality of line patterns M12 and surround peripheries of the plurality of line patterns M12.

Figure 2A:
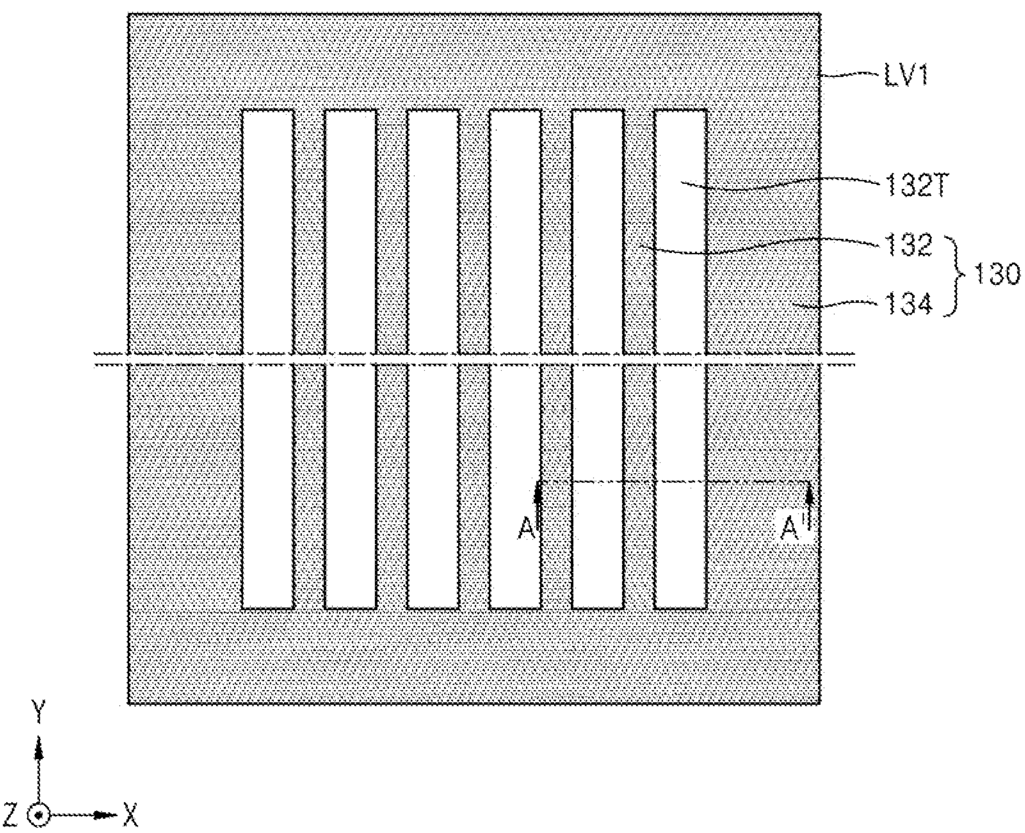
Figure 2B:
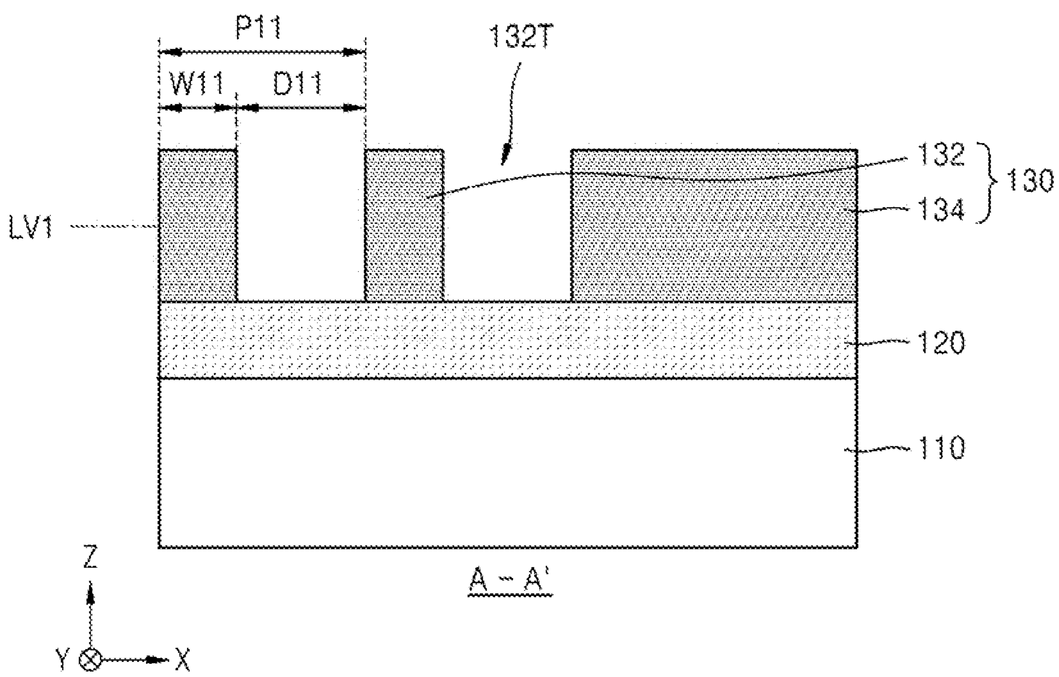

Referring to FIGS. 2A and 2B, a reference pattern structure 130 including a plurality of reference patterns 132 and a peripheral pattern 134 may be formed by patterning the reference pattern layer 130L by using the first mask pattern M10 as an etch mask.

The plurality of reference patterns 132 may be formed at positions respectively corresponding to the plurality of line patterns M12 of the first mask pattern M10 and may each have a first width W11 in a first direction X, e.g., and may be arranged of spaced apart from one another by a first interval D11 in the first direction X. In an implementation, the plurality of reference patterns 132 may be arranged at a first pitch P11, and when the plurality of feature patterns 122 are to be formed to have a width of 1F and a pitch of 2F (e.g., when a target feature size of the plurality of feature patterns 122 is 1F), the first pitch P11 may correspond to 8F. In an implementation, the first width W11 of each of the plurality of reference patterns 132 may correspond to 3F, and the first interval D11 may correspond to 5F. Here, F may be an arbitrary unit, e.g., 1F would be 1 arbitrary unit, 2F would be twice the dimension of 1F or 2 arbitrary units, etc.

A reference pattern trench 132T may be between two adjacent reference patterns 132 of the plurality of reference patterns 132. A top surface of the feature layer 120 may be exposed at a bottom portion of the reference pattern trench 132T.

The peripheral pattern 134 may be connected to both end portions of the plurality of reference patterns 132 and may surround peripheries of the plurality of reference patterns 132 in a plan view. The peripheral pattern 134 may be formed at a position corresponding to the peripheral pattern M14 of the first mask pattern M10.

In an implementation, the plurality of reference patterns 132 may be formed in or on a pattern formation region where a pattern having a fine pitch is to be formed, and the peripheral pattern 134 may be formed in or on a peripheral circuit region surrounding the pattern formation region or may be formed on a region where a pattern having a relatively large size is to be formed. In an implementation, the plurality of reference patterns 132 may be formed on a memory cell array region, and the peripheral pattern 134 may be formed on a boundary region or a peripheral circuit region surrounding the memory cell array region. In an implementation, the plurality of reference patterns 132 may be formed on a logic cell arrangement region, and the peripheral pattern 134 may be formed on an input/output (I/O) device arrangement region.

Figure 3A:
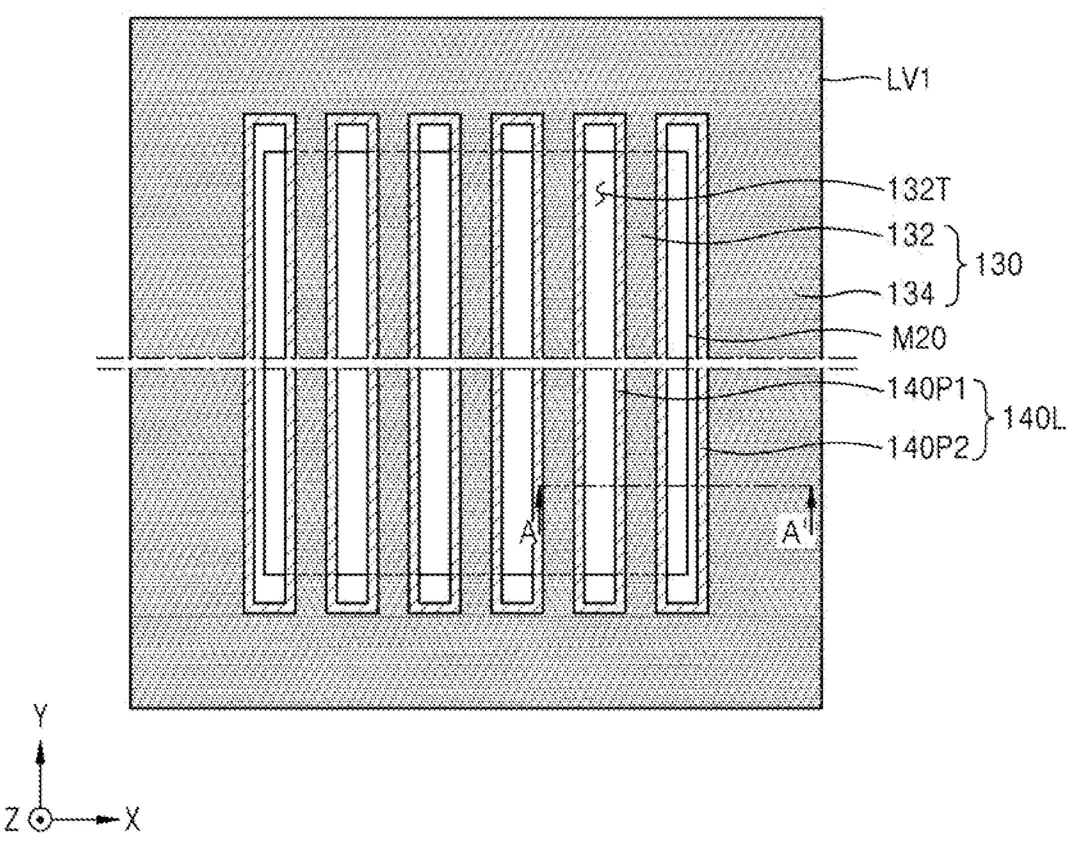
Figure 3B:
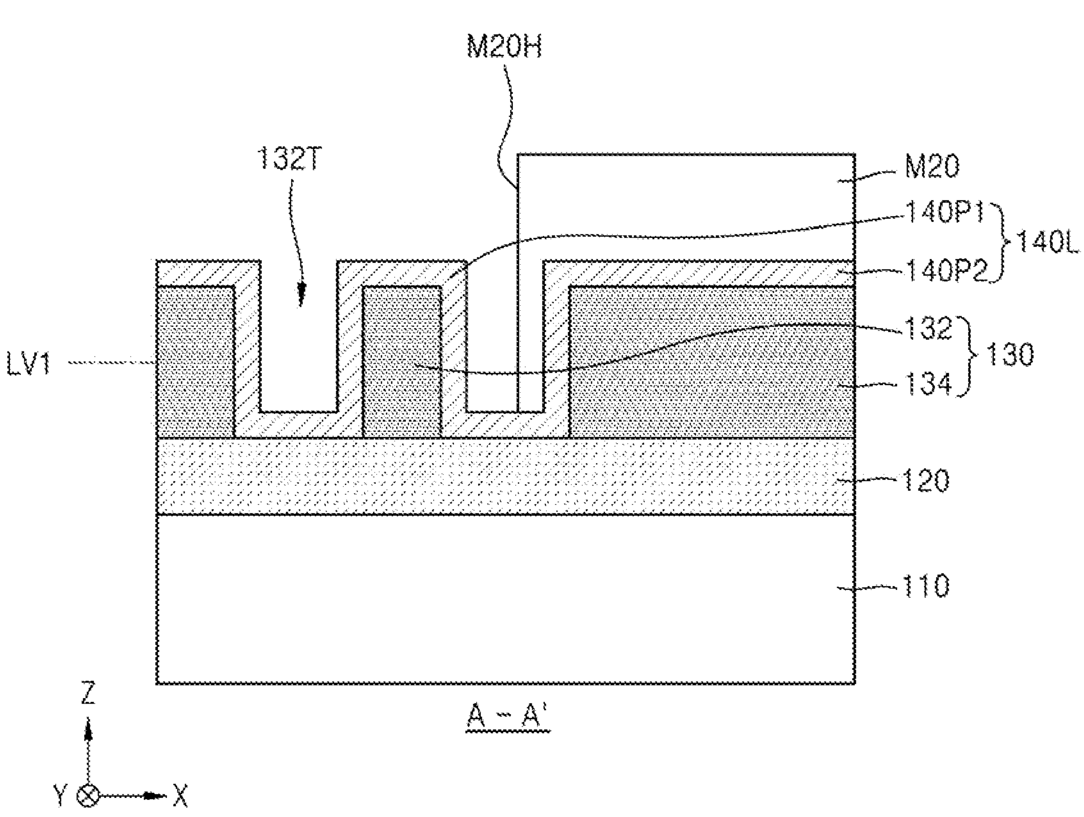

Referring to FIGS. 3A and 3B, a first spacer layer 140L may be formed on the feature layer 120 to cover the plurality of reference patterns 132 and the peripheral pattern 134.

A first portion 140P1 of the first spacer layer 140L may be conformally on both sidewalls and a top surface of each of the plurality of reference patterns 132 and on a top surface of the feature layer 120 exposed at a bottom portion of the reference pattern trench 132T. A second portion 140P2 of the first spacer layer 140L may be conformally on a sidewall and a top surface of the peripheral pattern 134.

In an implementation, the first spacer layer 140L may include a second material that is different from the first material included in the plurality of reference patterns 132 and the peripheral pattern 134. In an implementation, the second material may include, e.g., silicon oxide, silicon nitride, or silicon oxynitride. In an implementation, the first spacer layer 140L may be formed by an atomic layer stack process or a chemical vapor deposition process. In an implementation, the feature layer 120 and the first spacer layer 140L may include silicon oxide.

Subsequently, a second mask pattern M20 may be formed on the first spacer layer 140L. The second mask pattern M20 may include an opening portion M20H, and the opening portion M20H may vertically overlap the plurality of reference patterns 132 and may not vertically overlap the peripheral pattern 134. In an implementation, the first portion 140P1 of the first spacer layer 140L on the plurality of reference patterns 132 may be exposed, e.g., may not be covered by the second mask pattern M20, and the second portion 140P2 of the first spacer layer 140L on the peripheral pattern 134 may be covered by the second mask pattern M20.

Figure 4A:
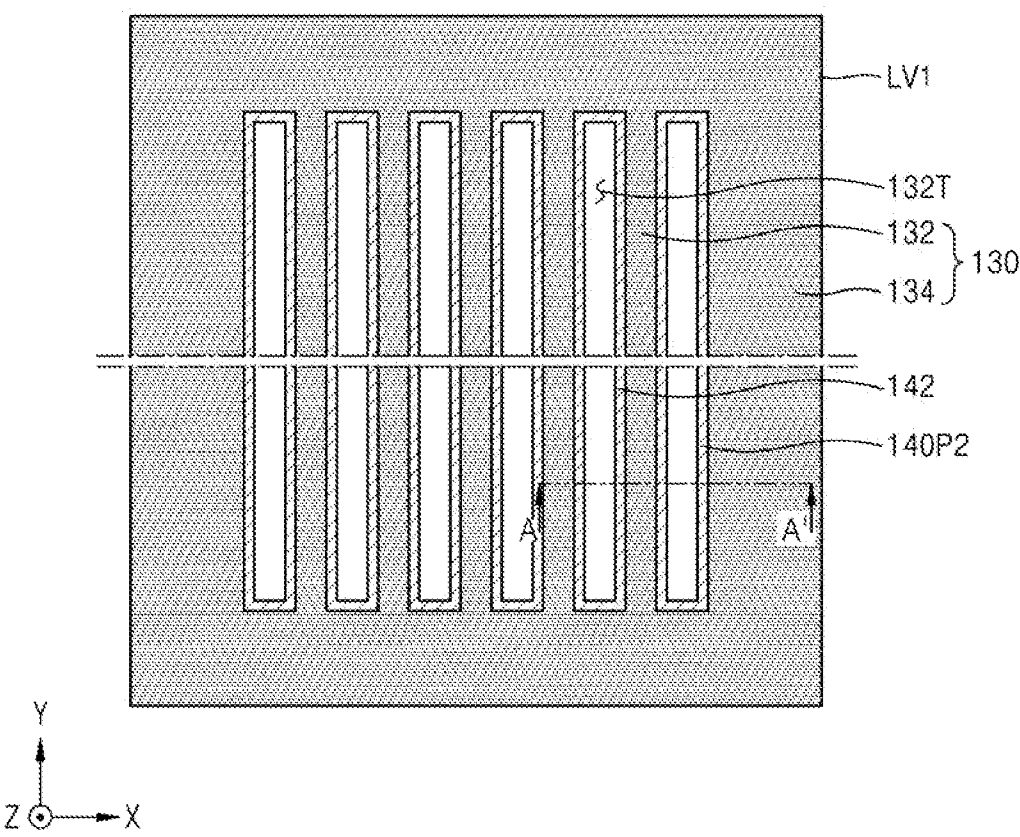
Figure 4B:
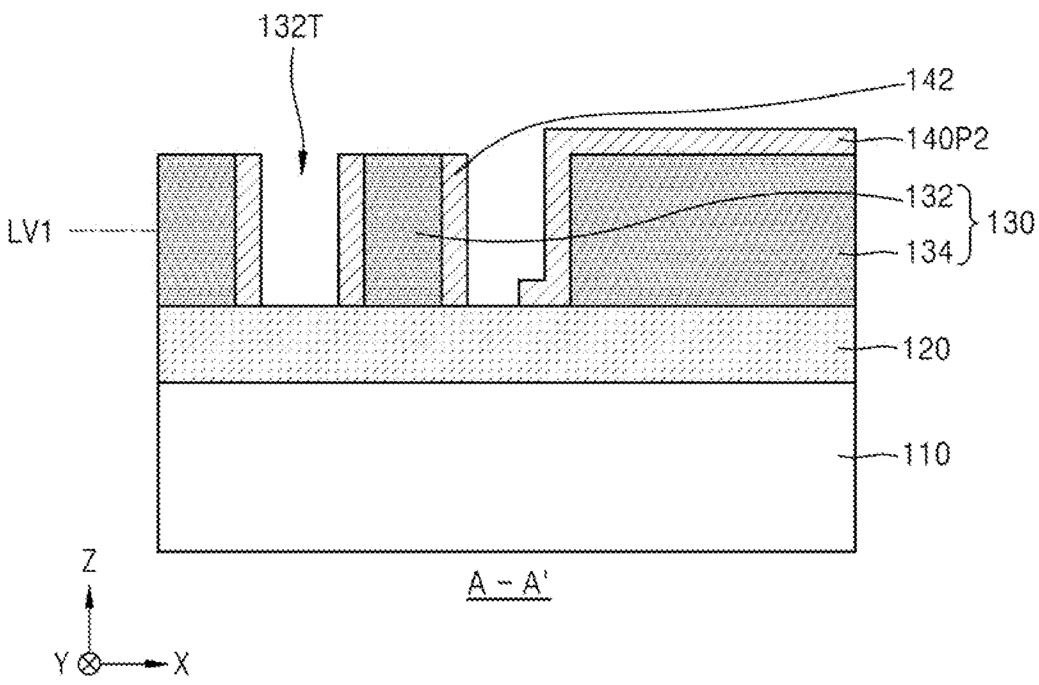

Referring to FIGS. 4A and 4B, a plurality of first spacers 142 may be formed on both sidewalls of each of the plurality of reference patterns 132 by performing an etch-back process on the first portion 140P1 of the first spacer layer 140L which is not covered by the second mask pattern M20.

In performing the etch-back process, a portion of the first portion 140P1 of the first spacer layer 140L on a top surface of each of the plurality of reference patterns 132 and a portion of the first portion 140P1 of the first spacer layer

140L on a top surface of the feature layer 120 at a bottom portion of the reference pattern trench 132T may be removed, and a first spacer 142 may remain on both sidewalls of each of the plurality of reference patterns 132. In an implementation, in performing the etch-back process, the second portion 140P2 of the first spacer layer 140L, e.g., where a top surface thereof is covered by the second mask pattern M20, may not be removed and may remain.

In an implementation, as seen in a vertical cross-sectional view in FIG. 4B, the number of first spacers 142 may be twice the number of reference patterns 132. In an implementation, one first spacer 142 may be on a first sidewall of one reference pattern 132, another first spacer 142 may be on a second sidewall, which is opposite to the first sidewall, of the one reference pattern 132, and two first spacers 142 may be spaced apart from each other in one reference pattern trench 132T.

Subsequently, the second mask pattern M20 may be removed.

Figure 5A:
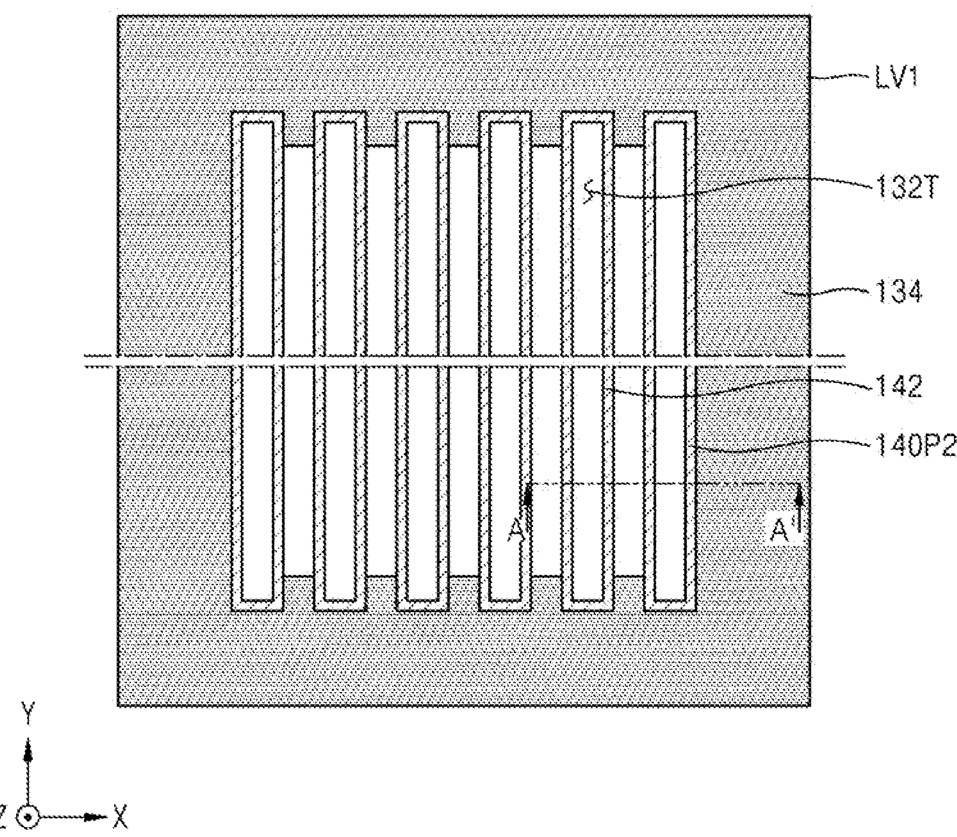
Figure 5B:
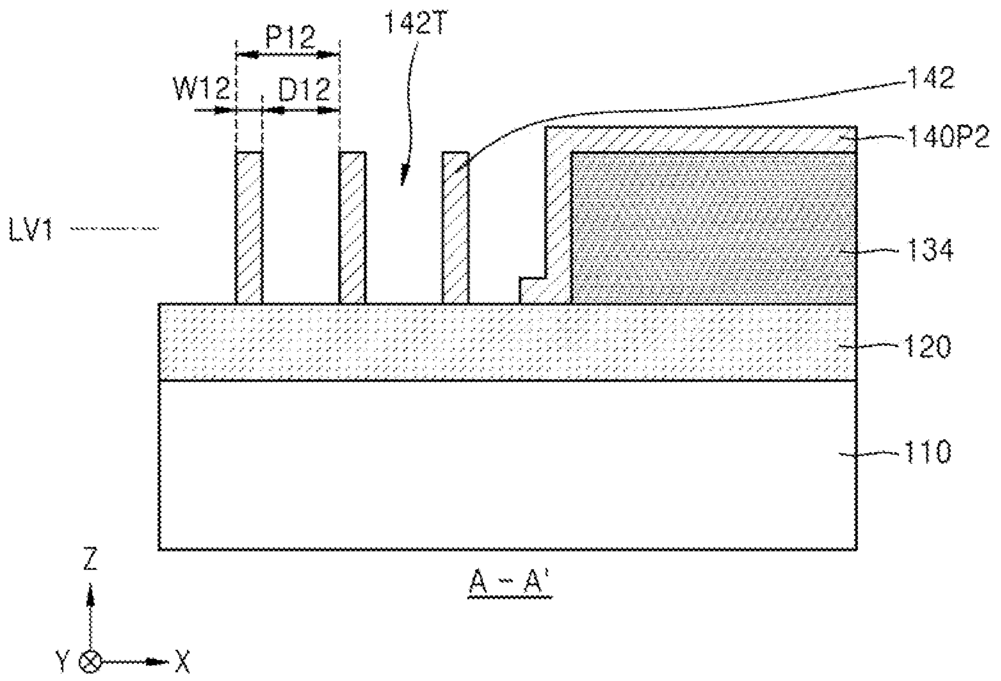

Referring to FIGS. 5A and 5B, the plurality of reference patterns 132 may be removed, and the plurality of first spacers 142 may remain on a top surface of the feature layer 120.

In an implementation, a process of removing the plurality of reference patterns 132 may be an etching process using an etch selectivity. In an implementation, when the plurality of reference patterns 132 are removed, the plurality of first spacers 142 may not be removed and may remain. In an implementation, in performing the etching process, the second portion 140P2 of the first spacer layer 140L on the peripheral pattern 134 may not be removed and may remain, and the peripheral pattern 134 may be covered by the second portion 140P2 of the first spacer layer 140L and thus may remain without being exposed.

The plurality of first spacers 142 may each have a second width W12 in the first direction X and may be spaced apart from one another by a second interval D12 in the first direction X. In an implementation, the plurality of first spacers 142 may be arranged at a second pitch P12, and when a target feature size of each of the plurality of feature patterns 122 is 1F, the second pitch P12 may correspond to 4F. In an implementation, the second width W12 of each of the plurality of first spacers 142 may correspond to 1F, and the second interval D12 may correspond to 3F.

A space between two adjacent first spacers 142 of the plurality of first spacers 142 may be referred to as a first spacer trench 142T, and the top surface of the feature layer 120 may be exposed at a bottom portion of the first spacer trench 142T.

In an implementation, as illustrated in a described with respect to FIGS. 4A to 5B, an etch-back process on the first spacer layer 140L and a process of removing the plurality of reference patterns 132 are sequentially performed. In an implementation, the etch-back process on the first spacer layer 140L and the process of removing the plurality of reference patterns 132 may be simultaneously performed.

Figure 6A:
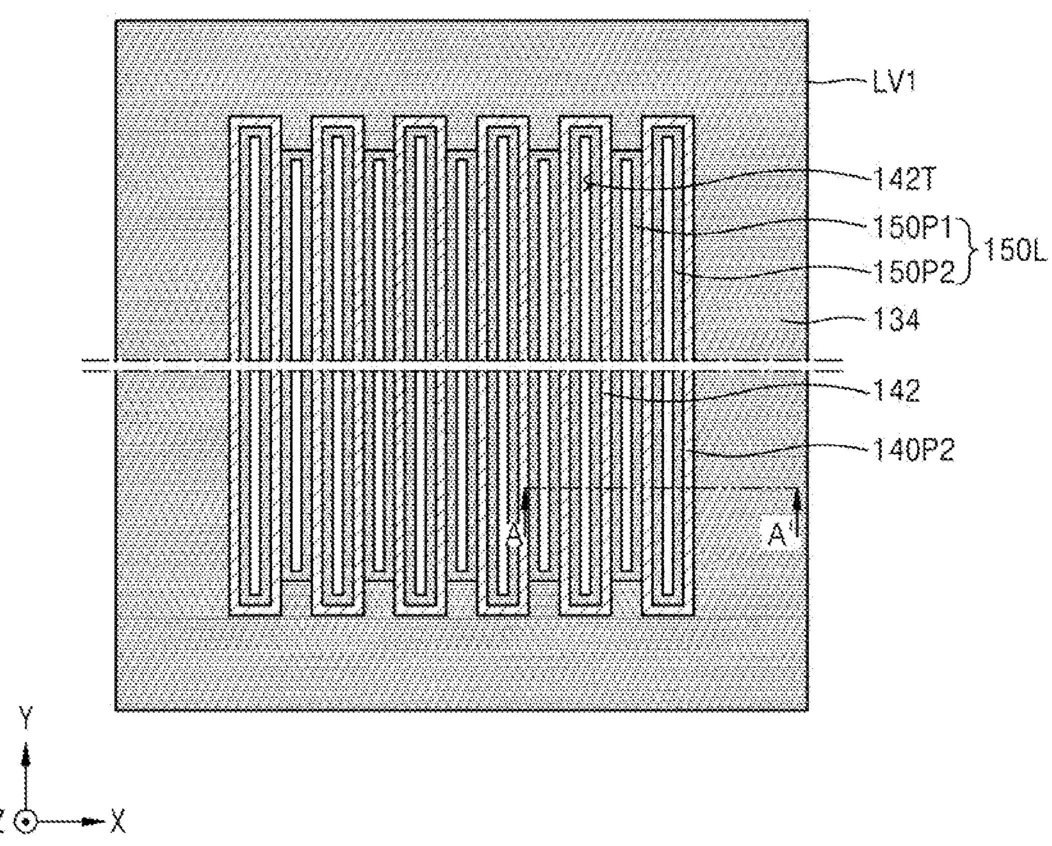
Figure 6B:
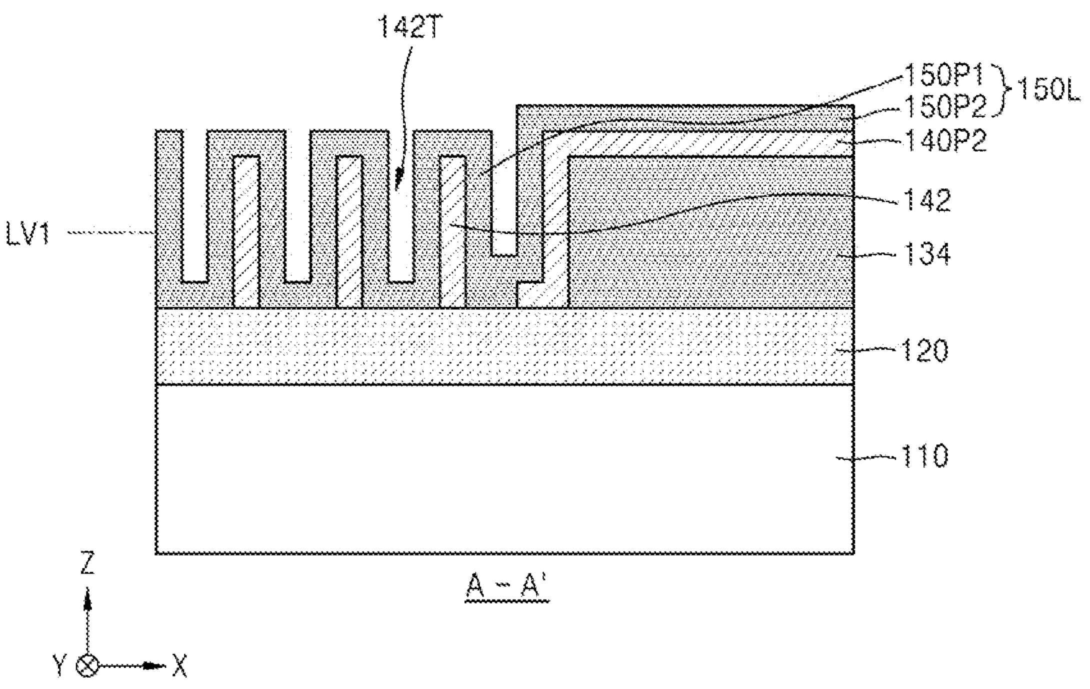

Referring to FIGS. 6A and 6B, a second spacer layer 150L conformally covering the plurality of first spacers 142 may be formed on the feature layer 120.

The second spacer layer 150L may include a first portion 150P1 on both sidewalls of the first spacer 142, and a second portion 150P2 on the second portion 140P2 on the peripheral pattern 134.

In an implementation, the second spacer layer 150L may include the first material. In an implementation, the first material may include, e.g., polysilicon or amorphous silicon. In an implementation, the second spacer layer 150L may include the same first material as the first material included in the plurality of reference patterns 132 (see FIG. 4B) and the peripheral pattern 134, or may include the same kind of material having an etch characteristic similar to that of the first material. In an implementation, the plurality of reference patterns 132 and the peripheral pattern 134 may include polysilicon, and the second spacer layer 150L may include polysilicon. In an implementation, the plurality of reference patterns 132 and the peripheral pattern 134 may include polysilicon, and the second spacer layer 150L may include amorphous silicon.

Figure 7A:
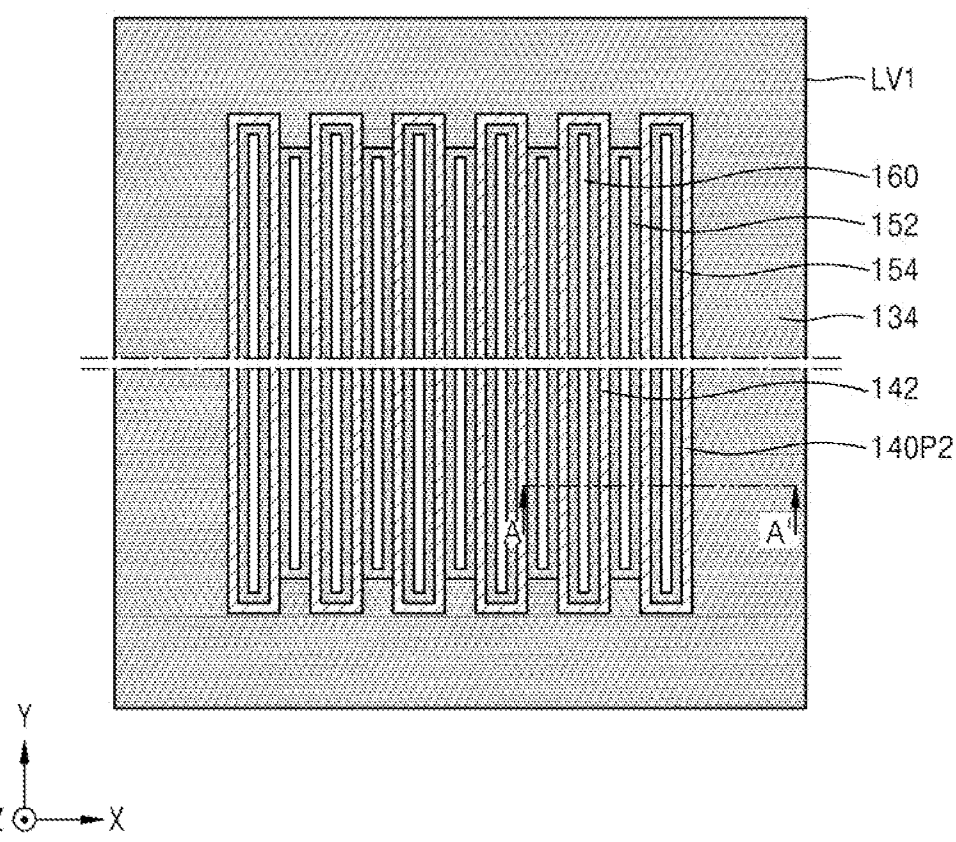
Figure 7B:
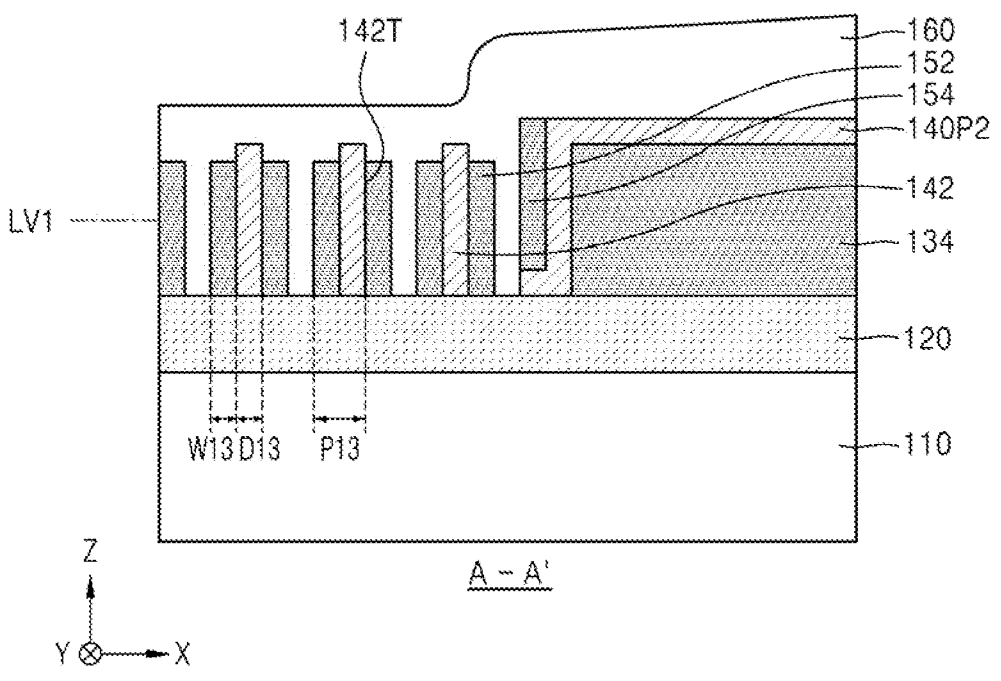

Referring to FIGS. 7A and 7B, a plurality of second spacers 152 may be formed on both sidewalls of each of the plurality of first spacers 142 by performing an etch-back process on the second spacer layer 150L.

In performing the etch-back process, a portion of the first portion 150P1 of the second spacer layer 150L on a top surface of each of the plurality of first spacers 142 and a portion of the first portion 150P1 of the second spacer layer 150L on the top surface of the feature layer 120 at a bottom portion of the first spacer trench 142T may be removed, and a second spacer 152 may remain on both sidewalls of each of the plurality of first spacers 142.

In an implementation, in performing the etch-back process, a portion of the second portion 150P2 of the second spacer layer 150L on the top surface of the peripheral pattern 134 may also be removed (e.g., together with the portion of the first portion 150P1 of the second spacer layer 150L), and the second portion 140P2 of the first spacer layer 140L on the top surface of the peripheral pattern 134 may be exposed.

In performing the etch-back process, the second portion 140P2 of the first spacer layer 140L may be on a sidewall of the peripheral pattern 134, and a portion of the second portion 150P2 of the second spacer layer 150L may remain on a sidewall of the second portion 140P2 of the first spacer layer 140L. In an implementation, a portion of the second portion 150P2 of the second spacer layer 150L on a sidewall of the peripheral pattern 134 may be referred to as an edge spacer pattern 154.

In an implementation, as illustrated in FIG. 7B, a top surface of the edge spacer pattern 154 may be at a level that is higher than (e.g., farther from the substrate in a vertical Z direction than) a top surface of each of the plurality of second spacers 152. In an implementation, the top surface of each of the plurality of second spacers 152 may be at a level that is lower than the top surface of each of the plurality of first spacers 142.

In an implementation, as seen in a vertical cross-sectional view in FIG. 7B, the number of second spacers 152 may be twice the number of first spacers 142. In an implementation, one second spacer 152 may be on a first sidewall of one first spacer 142, another second spacer 152 may be on a second sidewall, which is opposite to the first sidewall, of the one first spacer 142, and two second spacers 152 may be spaced apart from each other in one first spacer trench 142T.

The plurality of second spacers 152 may each have a third width W13 in the first direction X and may be spaced apart from one another by a third interval D13 in the first direction X. In an implementation, the plurality of second spacers 152 may be arranged at a third pitch P13, and when a target feature size of each of the plurality of feature patterns 122 is 1F, the third pitch P13 may correspond to 2F. In an implementation, the third width W13 of each of the plurality of second spacers 152 may correspond to 1F, and the third interval D13 may correspond to 1F.

Subsequently, a gap-fill insulation layer 160 may be formed to cover the feature layer 120, the plurality of first spacers 142, and the plurality of second spacers 152 and may fill the first spacer trench 142T.

The gap-fill insulation layer 160 may include the second material. In an implementation, the second material may include, e.g., silicon oxide, silicon nitride, silicon oxynitride, or a spin-on hardmask (SOH). In an implementation, the gap-fill insulation layer 160 may include the same material as a material included in the plurality of first spacers 142, or may include the same kind of material having an etch characteristic similar to that of the material. In an implementation, the plurality of first spacers 142 may include silicon oxide, and the gap-fill insulation layer 160 may include silicon oxide. In an implementation, the plurality of first spacers 142 may include silicon oxide, and the gap-fill insulation layer 160 may include an SOH.

In an implementation, the gap-fill insulation layer 160 may be formed to have a top level where a top level of a portion of the gap-fill insulation layer 160 on the peripheral pattern 134 and the second portion 140P2 of the first spacer layer 140L is higher than a portion of the gap-fill insulation layer 160 on a top surface of each of the plurality of first spacers 142 and the plurality of second spacers 152.

Figure 8:
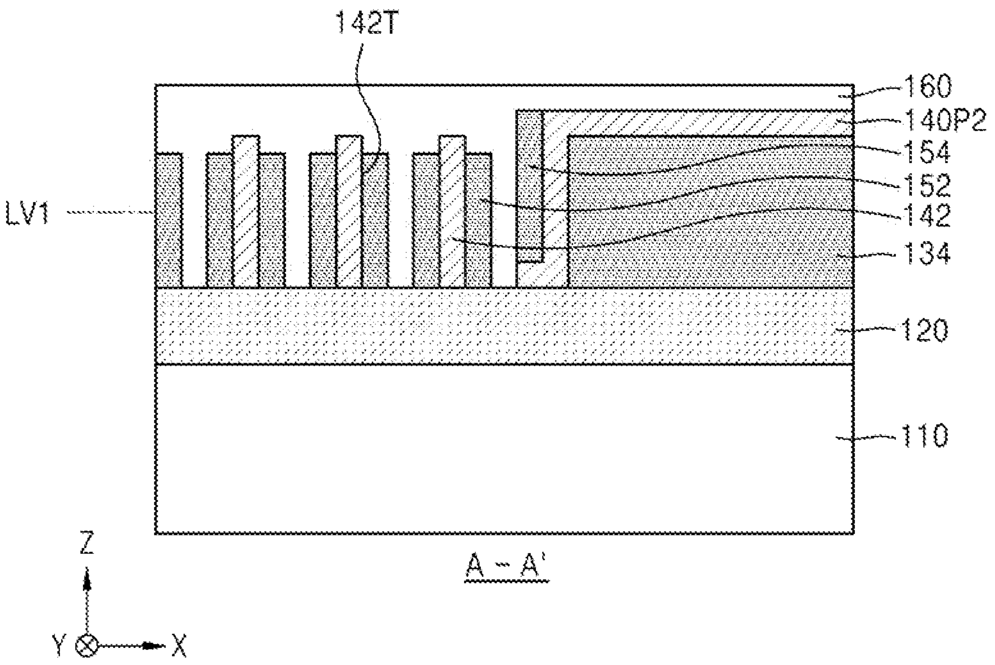

Referring to FIG. 8, a planarization process may be performed on an upper portion of the gap-fill insulation layer 160. Through the planarization process, a height difference between a top level of the gap-fill insulation layer 160 on the second portion 140P2 of the first spacer layer 140L and a top level of the gap-fill insulation layer 160 on the plurality of second spacers 152 may be reduced.

In an implementation, as illustrated in FIG. 8, the planarization process may be performed until the gap-fill insulation layer 160 has a certain thickness and remains on the second portion 140P2 of the first spacer layer 140L. In an implementation, the planarization process may be performed until all of the gap-fill insulation layer 160 is removed from the second portion 140P2 of the first spacer layer 140L and a top surface of the second portion 140P2 of the first spacer layer 140L is exposed. In this case, the gap-fill insulation layer 160 may fill only a space between the plurality of second spacers 152.

Figure 9A:
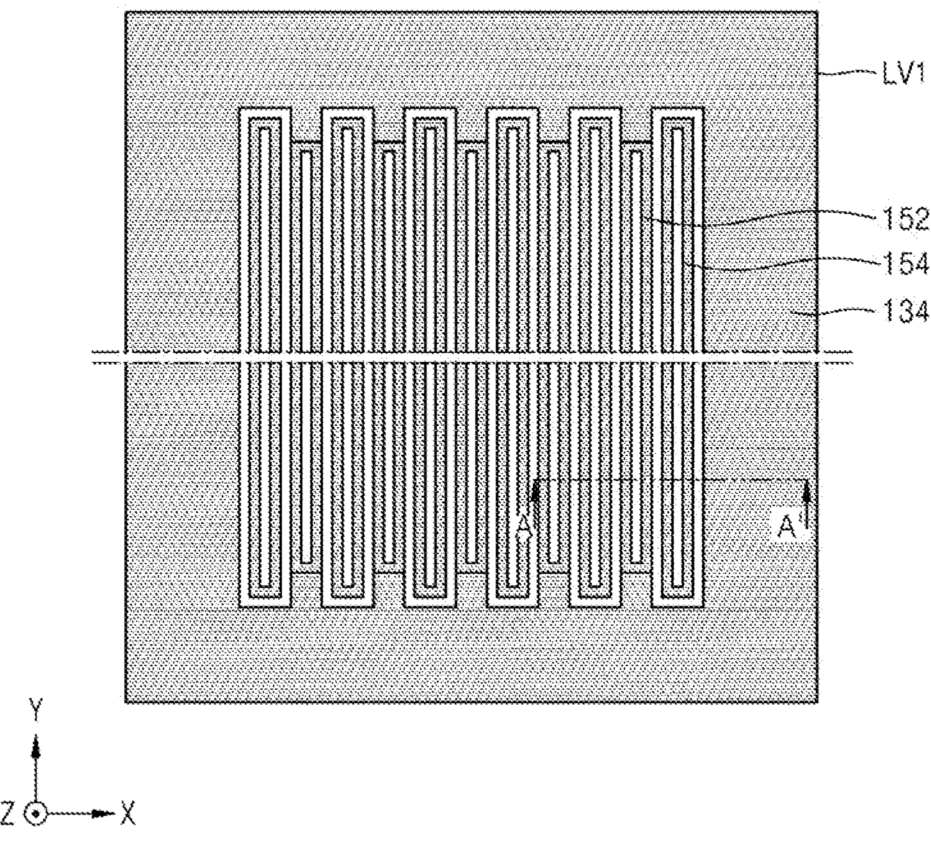
Figure 9B:
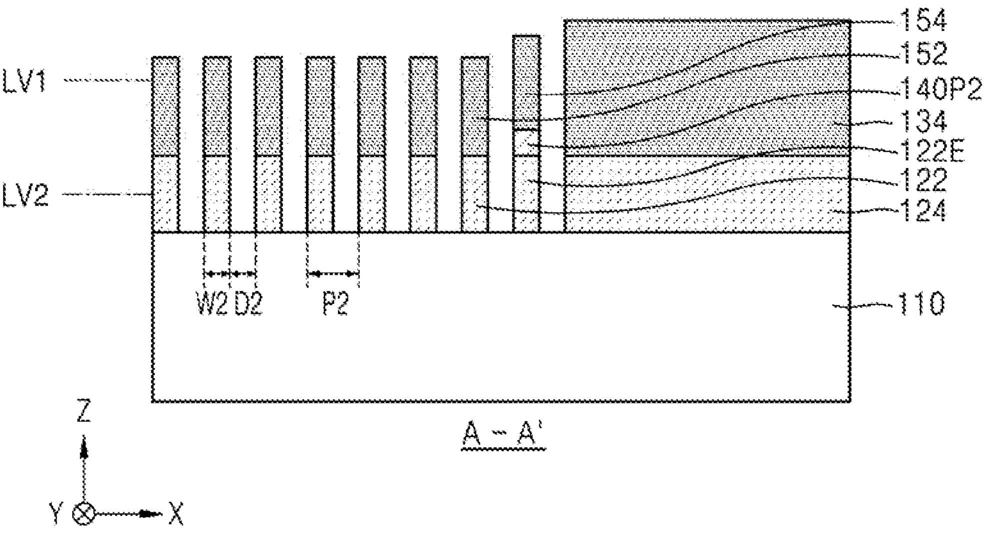

Referring to FIGS. 9A and 9B, by removing the plurality of first spacers 142 and the gap-fill insulation layer 160, the plurality of second spacers 152 and the peripheral pattern 134 may remain on the feature layer 120.

In an implementation, the plurality of first spacers 142 and the gap-fill insulation layer 160 may include the same second material or the same kind of materials having similar etch characteristics, and thus, a process of removing the plurality of first spacers 142 and the gap-fill insulation layer 160 may be performed at an etching step using the same etch recipe or etchant.

In an implementation, the process of removing the plurality of first spacers 142 and the gap-fill insulation layer 160 may be performed under etchings conditions having an etch selectivity with respect to the plurality of second spacers 152 and the peripheral pattern 134. In performing an etching process of removing the plurality of first spacers 142 and the gap-fill insulation layer 160, the plurality of second spacers 152 and the peripheral pattern 134 may not be removed, and may remain. In an implementation, the second portion 140P2 of the first spacer layer 140L on a sidewall of the peripheral pattern 134 may be removed, and only the second portion 140P2 of the first spacer layer 140L under the edge spacer pattern 154 may remain.

Subsequently, a plurality of feature patterns 122 and a bulk pattern 124 may be formed by etching the feature layer 120 by using the plurality of second spacers 152 and the peripheral pattern 134 as an etch mask.

The plurality of feature patterns 122 may be formed at positions respectively corresponding to (e.g., underlying) the plurality of second spacers 152, and the bulk pattern 124 may be formed at a position corresponding to the peripheral pattern 134. An edge pattern 122E may be formed at a position corresponding to the edge spacer pattern 154.

In an implementation, the plurality of feature patterns 122 may each have a fourth width W2 in the first direction X and may be spaced apart from one another by a fourth interval D2 in the first direction X. In an implementation, the plurality of feature patterns 122 may be arranged at a fourth pitch P2, and when a target feature size of each of the plurality of feature patterns 122 is 1F, the fourth pitch P2 may correspond to 2F. In an implementation, the fourth width W2 of each of the plurality of feature patterns 122 may correspond to 1F, and the fourth interval D2 may correspond to 1F.

Figure 10A:
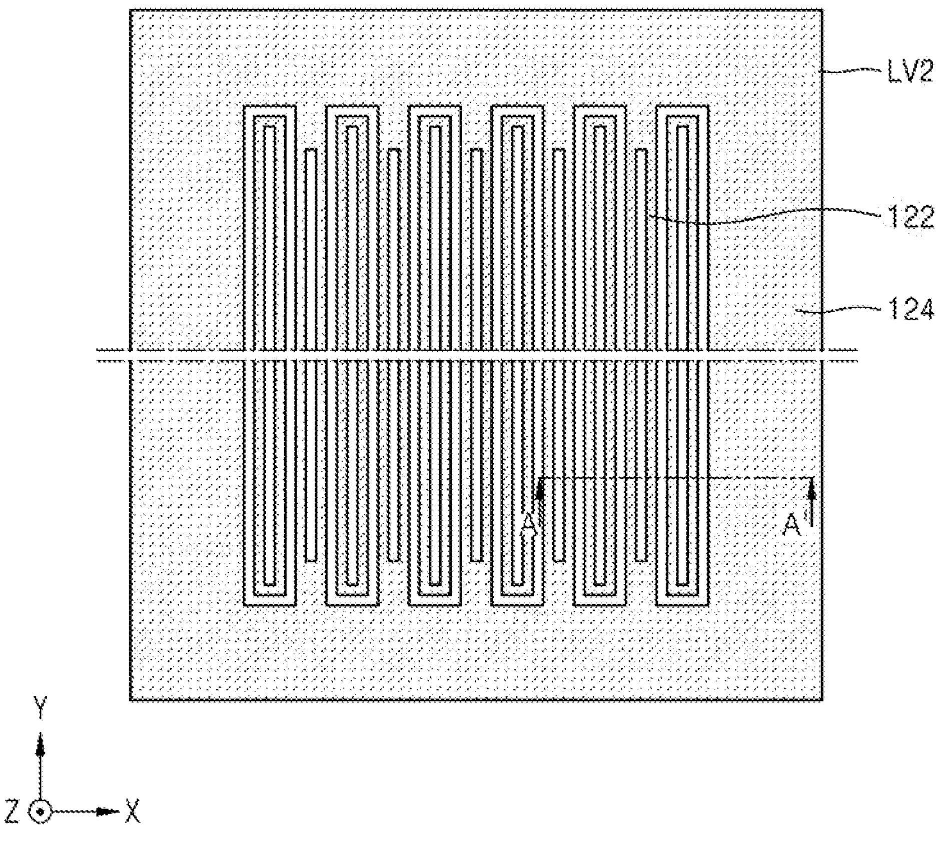
FIG. 10A is a horizontal cross-sectional view taken along a line at a second vertical level LV2 of FIG. 10B in process sequence.
Figure 10B:
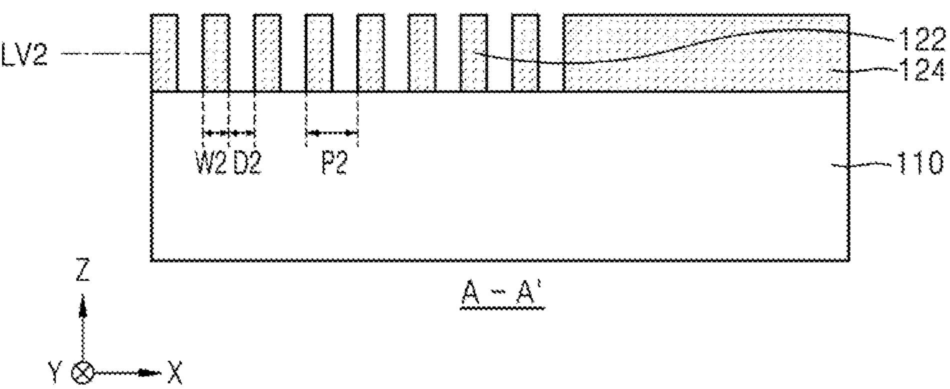

Referring to FIGS. 10A and 10B, depending on the case, the plurality of second spacers 152, the peripheral pattern 134, and the edge spacer pattern 154 may be removed, and the plurality of feature patterns 122 and the bulk pattern 124 may remain.

According to a method of manufacturing a semiconductor device according to embodiments, the plurality of feature patterns 122 having a fine pitch may be formed based on quadruple patterning technology using a simple stack configuration.

In quadruple patterning technology, a double patterning process may be performed twice by using a stack configuration which includes a plurality of pattern transfer sacrificial layers and has a relatively large height. A first spacer having a pitch of 4F may be formed on a sidewall of a reference pattern having a pitch of 8F, a first sacrificial pattern may be formed in a first sacrificial layer under the first spacer, a second spacer having a pitch of 2F may be formed on a sidewall of the first sacrificial pattern, a second sacrificial pattern may be formed in a second sacrificial layer under the second spacer, and a plurality of feature patterns may be formed by using the second sacrificial pattern. A tail portion or an inclined portion could be formed at a sidewall of the first sacrificial layer in a process of etching a carbon material used as the first sacrificial layer, and a process error or defect could occur in a process of etching a polysilicon material used as the second sacrificial layer.

According to an embodiment, the plurality of reference patterns 132 may be removed after the first spacer 142 is formed on both sidewalls of each of the plurality of reference patterns 132, the first spacer 142 may be removed after the second spacer 152 is formed of the same material or the same kind of material as that of the reference pattern 132 on both sidewalls of the first spacer 142, and the feature layer 120 may be patterned by using the second spacer 152. The plurality of reference patterns 132 and the second spacer 152 may include the same material, and only a pattern formation region may be patterned at a fine pitch in a state where a peripheral region (e.g., the peripheral pattern 134) of each of the plurality of reference patterns 132 is covered. Therefore, pattern transfer processes using the first sacrificial layer and the second sacrificial layer may be omitted, and a process error or defect occurring due to the first and second sacrificial layers may be reduced or prevented. Therefore, according to the method of manufacturing the semiconductor device, a patterning process for a fine pattern may be precisely adjusted.

Figure 11A:
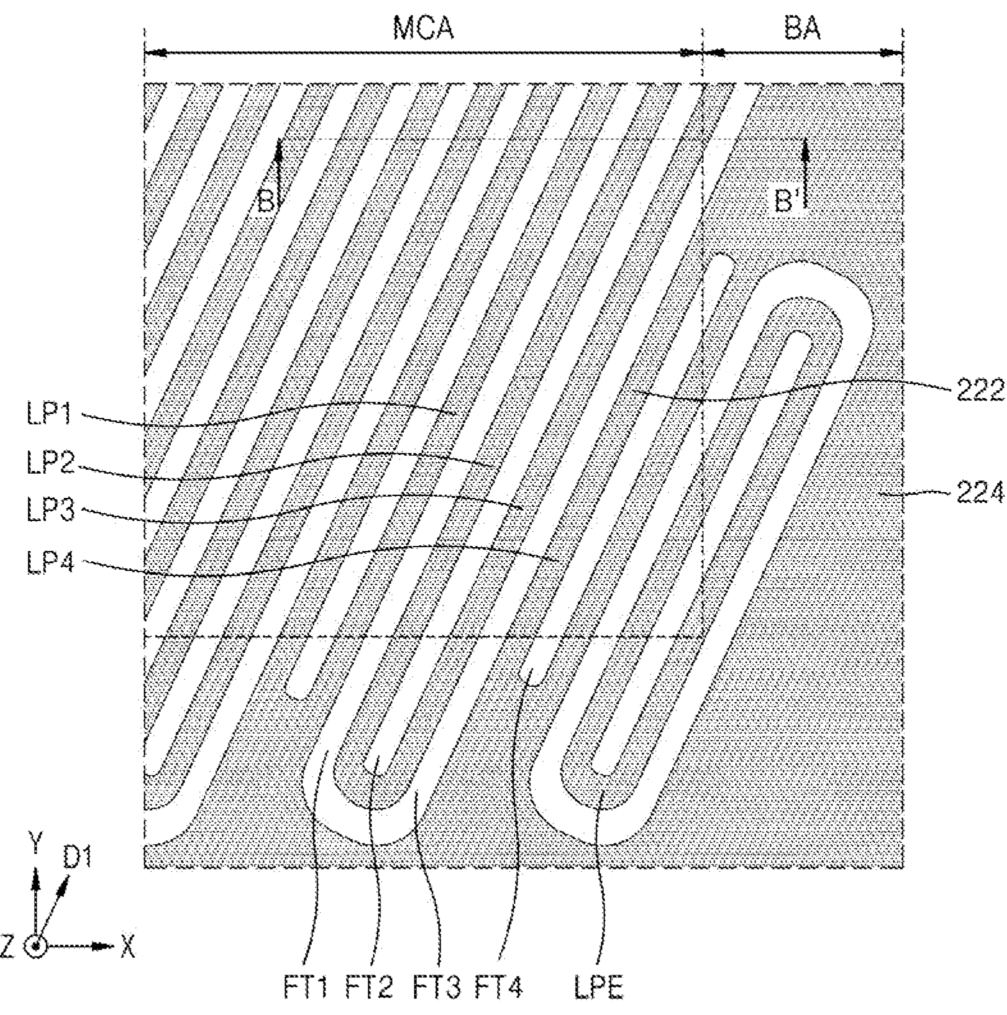
Figure 11B:
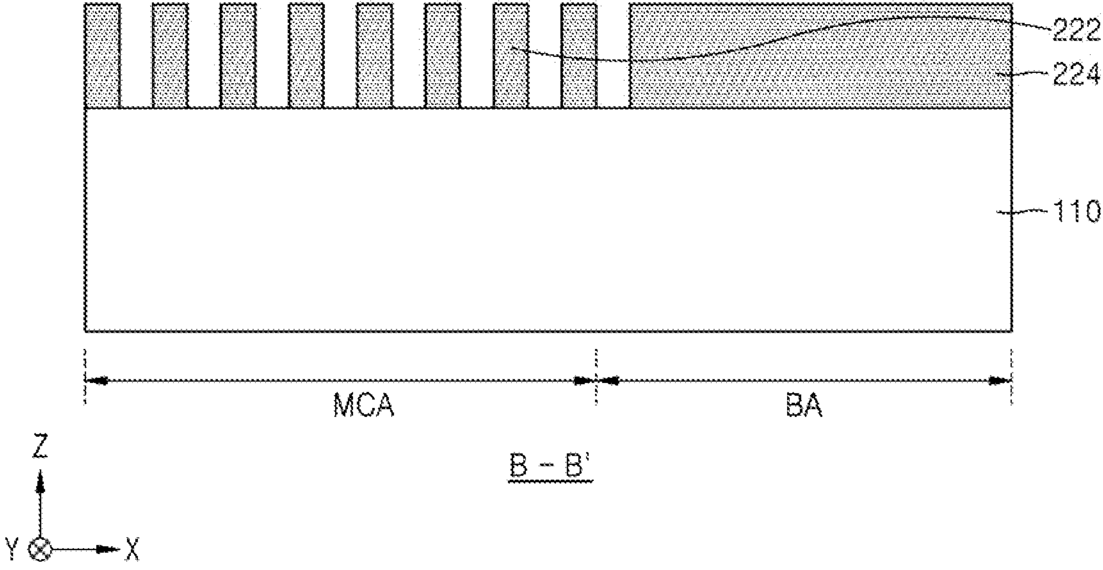
FIGS. 11B and 12B are cross-sectional views taken along line B-B' of FIGS. 11A and 12A.
Figure 12A:
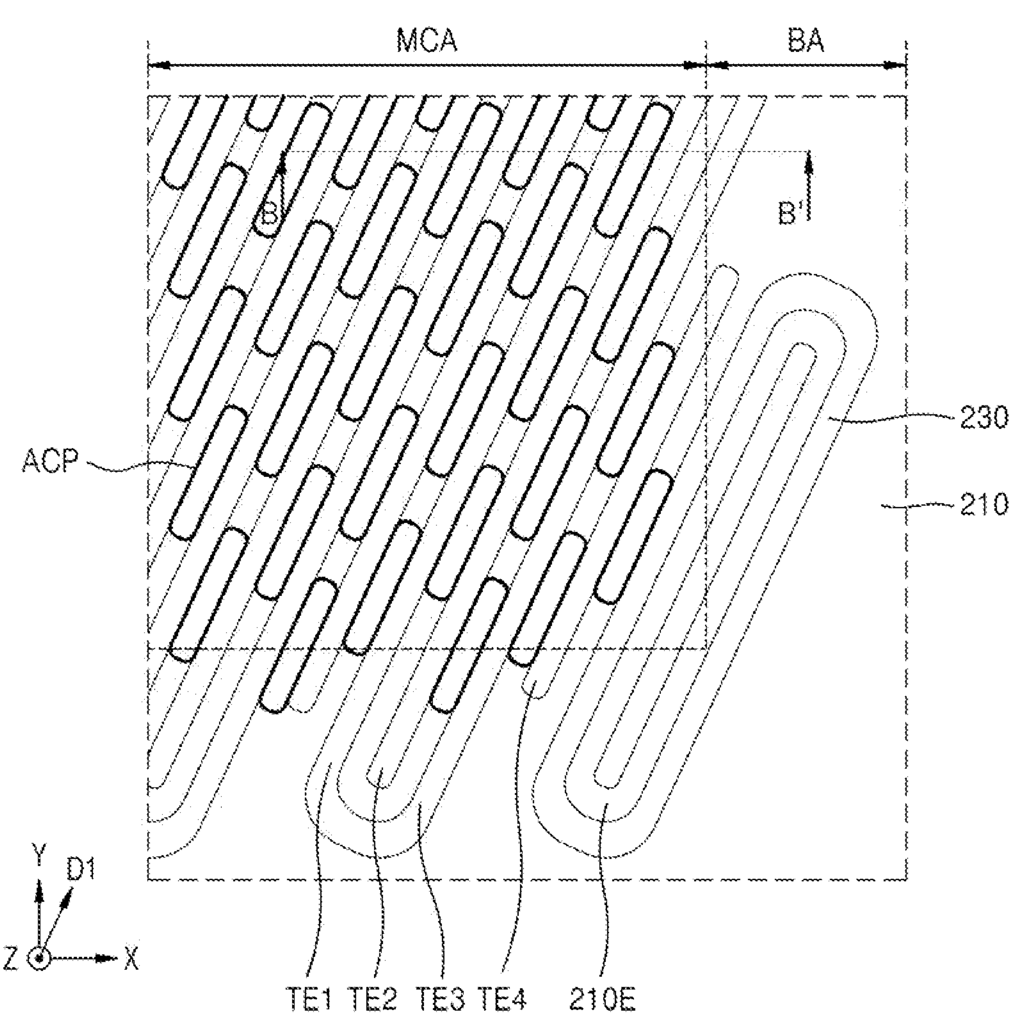
Figure 12B:
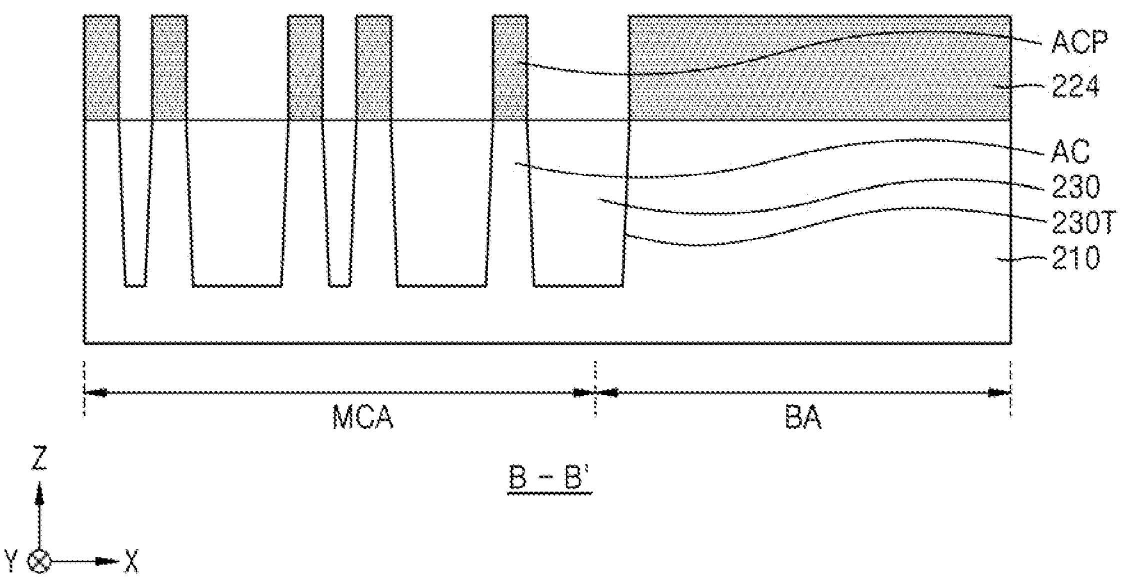
Figure 13:
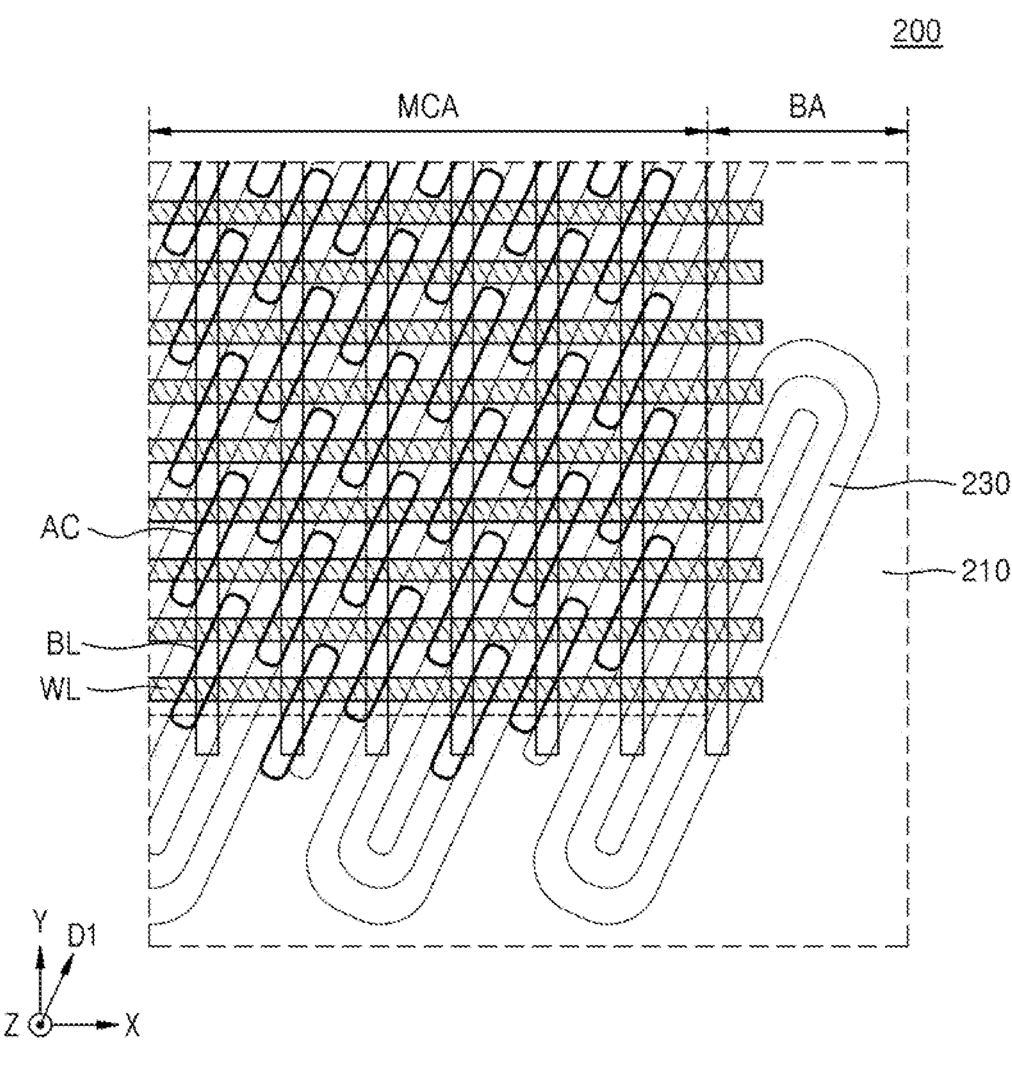

FIGS. 11A to 13 are schematic diagrams illustrating stages in a method of manufacturing a semiconductor device 200, according to embodiments. FIGS. 11A, 12A, and 13 are plan views illustrating stages in a method of manufacturing the semiconductor device 200 in process sequence, and FIGS. 11B and 12B are cross-sectional views taken along line B-B' of FIGS. 11A and 12A.

Referring to FIGS. 11A and 11B, a plurality of feature patterns 222 and a bulk pattern 224 may be formed on a substrate 210 by performing a process described above with reference to FIGS. 1A to 10.

The substrate 210 may include a cell array region MCA and a boundary region BA, the plurality of feature patterns 222 may extend in a first diagonal direction D1 on the cell array region MCA, and the bulk pattern 224 may be on the boundary region BA.

In an implementation, the cell array region MCA may be a region where unit memory cells of a dynamic random access memory (DRAM) device are to be formed, and the boundary region BA may be a region where a peripheral circuit for driving the unit memory cells formed in the cell array region MCA is to be formed.

In an implementation, the plurality of feature patterns 222 may be formed of silicon oxide. The plurality of feature patterns 222 may include a plurality of line patterns extending in the first diagonal direction D1, and the bulk pattern 224 may be connected to end portions of the plurality of feature patterns 222 and may surround the plurality of feature patterns 222 in a plan view.

The plurality of feature patterns 222 may include a plurality of sets each including line patterns, and one set including the line patterns may include a first line pattern LP1, a second line pattern LP2, a third line pattern LP3, and a fourth line pattern LP4, which are continuously arranged.

In an implementation, an extension portion of the second line pattern LP2 and an extension portion of the third line pattern LP3 each extending to the boundary region BA may be connected to each other, and a portion at which the extension portion of the second line pattern LP2 is connected to the extension portion of the third line pattern LP3 may be referred to as an extension portion edge pattern LPE. The extension portion edge pattern LPE may correspond to an edge pattern 122E formed by using, as an etch mask, the edge spacer pattern 154 described above with reference to FIGS. 9A and 9B.

In an implementation, a length of the extension portion of the second line pattern LP2 and a length of the extension portion of the third line pattern LP3 may be greater than a length of an extension portion of the fourth line pattern LP4 and a length of an extension portion of the first line pattern LP1.

A plurality of sets each including trenches may be arranged between two adjacent line patterns of a plurality of sets each including line patterns of the plurality of feature patterns 222. One set including the trenches may include a first trench FT1, a second trench FT2, a third trench FT3, and a fourth trench FT4, which are consecutively arranged. In an implementation, the first trench FT1 may be between the first line pattern LP1 and the second line pattern LP2, the second trench FT2 may be between the second line pattern LP2 and the third line pattern LP3, the third trench FT3 may be between the third line pattern LP3 and the fourth line pattern LP4, and the fourth trench FT4 may be between the fourth line pattern LP4 and the first line pattern LP1.

In an implementation, an extension portion of the first trench FT1 and an extension portion of the third trench FT3 each extending to the boundary region BA may be connected to each other. In an implementation, the extension portion of the first trench FT1 and the extension portion of the third trench FT3 may surround an extension portion of the second trench FT2 and may be connected to each other one-dimensionally. An extension portion of the fourth trench FT4 may be surrounded by the bulk pattern 224 and may not be connected to the other trenches.

Referring to FIGS. 12A and 12B, a mask pattern may be formed on the plurality of feature patterns 222 and the bulk pattern 224, and a plurality of active region patterns ACP may be formed by removing a portion of each of the plurality of feature patterns 222. The plurality of active region patterns ACP may have a plurality of island shapes having a long axis in the first diagonal direction D1.

Subsequently, a device isolation trench 230T may be formed by removing a portion of the substrate 210 by using the plurality of active region patterns ACP and the bulk pattern 224 as an etch mask, and a device isolation layer 230 may be formed of an insulating material in the device isolation trench 230T. A plurality of active regions AC may be defined by the device isolation layer 230.

On the boundary region BA, a portion of the device isolation trench 230T may have a shape where a first extension portion TE1, a second extension portion TE2, a third extension portion TE3, and a fourth extension portion TE4 are repeatedly arranged. In an implementation, the first extension portion TE1 may be connected to the third extension portion TE3. In an implementation, a connection portion between the first extension portion TE1 and the third extension portion TE3 may surround the second extension portion TE2 in a plan view. The first extension portion TE1 and the third extension portion TE3 may have a length that is greater than that of the second extension portion TE2. The first extension portion TE1 and the third extension portion TE3 may have a length that is greater than that of the fourth extension portion TE4.

In an implementation, a portion of the substrate 210 corresponding to the extension portion edge pattern LPE may be referred to as a boundary edge pattern 210E. The boundary edge pattern 210E may be surrounded by the device isolation layer 230 and may include a portion having a U-shape in a plan view.

Referring to FIG. 13, a word line trench extending in the first direction X may be formed in the substrate 210, and a word line WL including a plurality of gate dielectric layers and a plurality of gate electrodes may be formed in a word line trench.

Subsequently, a direct contact connected to the active region AC and a bit line BL connected to the direct contact to extend in the second direction Y may be formed on the substrate 210. A contact connected to the active region AC may be formed between adjacent bit lines BL, and a storage node may be formed on the contact.

In an implementation, the active region AC having a fine pitch may be formed by using the method described above with reference to FIGS. 1A to 10B, and thus, a patterning process performed on the active region AC may be precisely adjusted. The semiconductor device 200 may have a good electrical characteristic.

In an implementation, as illustrated in and described with respect to FIGS. 11A to 13, the method of manufacturing a DRAM may use the method described above with reference to FIGS. 1A to 10B. In addition to the method of manufacturing the DRAM device, a method of manufacturing a semiconductor device according to an embodiment may include a method of manufacturing various devices such as a logic device, a flash memory device, a vertical NAND memory device, a phase change memory device, a magnetic memory device, or a complementary metal-oxide semiconductor (CMOS) image sensor by using the method described above with reference to FIGS. 1A to 10B.

Figure 14A:
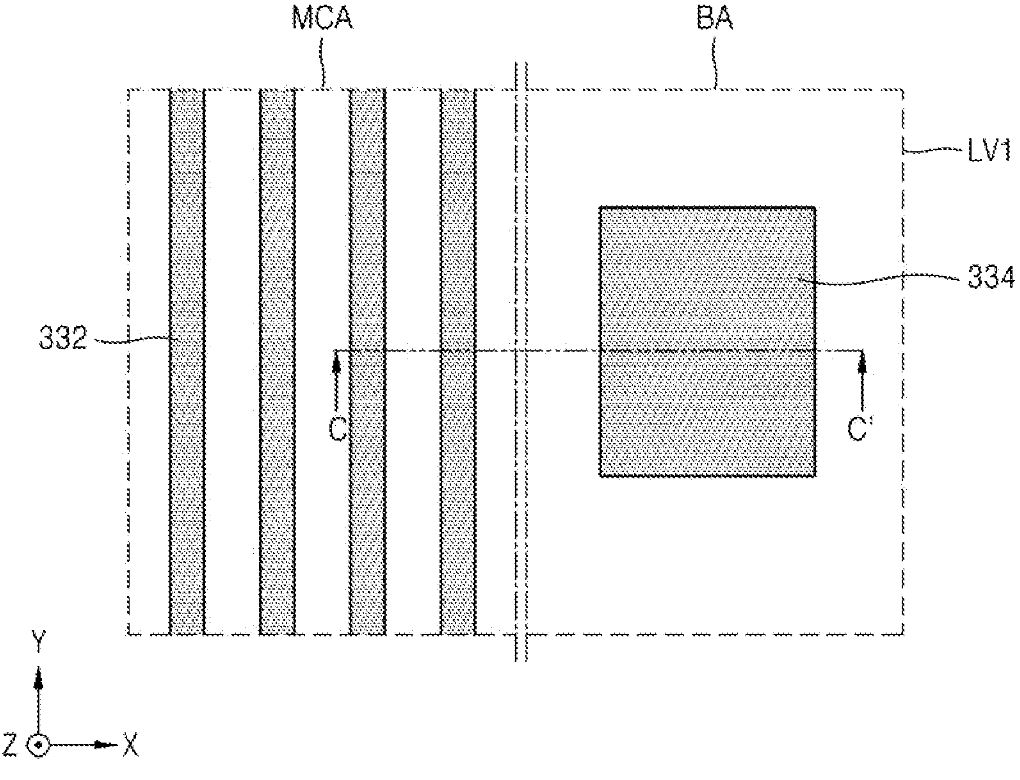

FIGS. 14A to 19B are schematic diagrams illustrating stages in a method of manufacturing a semiconductor device 300, according to embodiments. FIGS. 14A and 19A are plan views illustrating stages in a method of manufacturing a semiconductor device in process sequence, and FIGS. 14B, 15 to 18, and 19B are cross-sectional views taken along line C-C' of FIG. 14A.

Figure 14B:
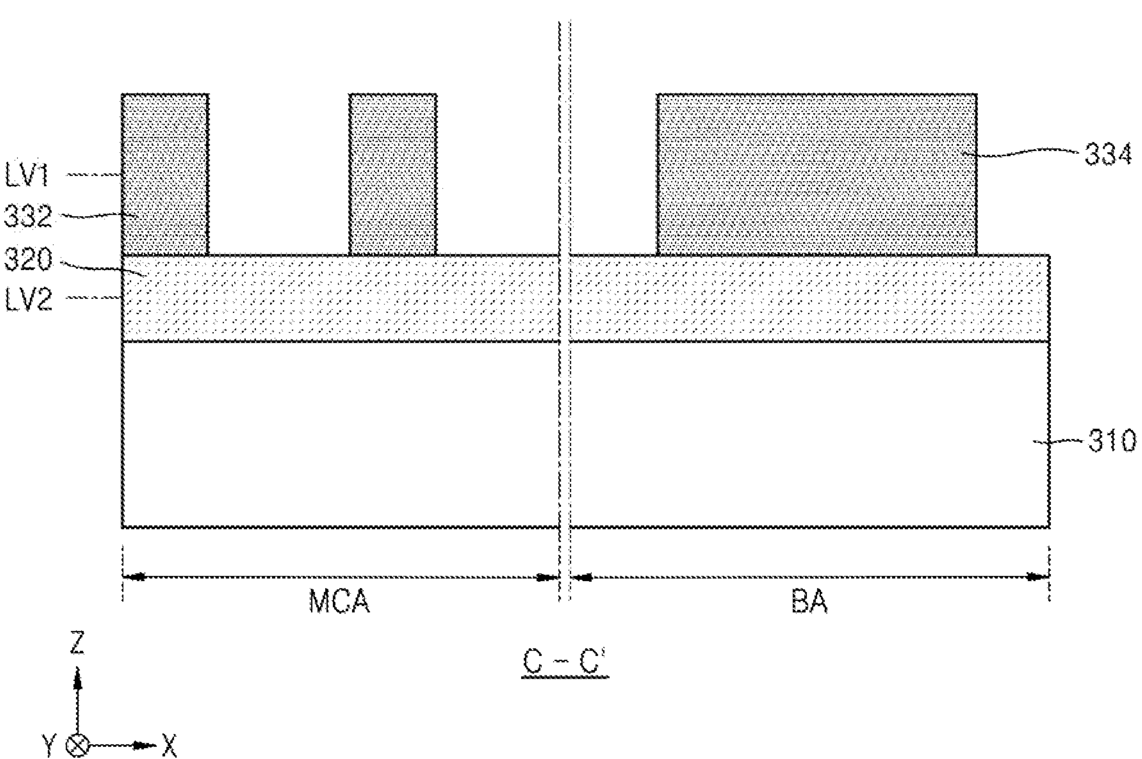

Referring to FIGS. 14A and 14B, a feature layer 320 may be formed on a substrate 310 including a cell array region MCA and a boundary region BA.

A reference pattern layer may be formed on the feature layer 320, a plurality of reference patterns 332 may be formed on the cell array region MCA by patterning the reference pattern layer, and an align key reference pattern 334 may be formed on the boundary region BA. In an implementation, the plurality of reference patterns 332 and the align key reference pattern 334 may be formed of a first material, and the first material may include polysilicon or amorphous silicon.

Figure 15:
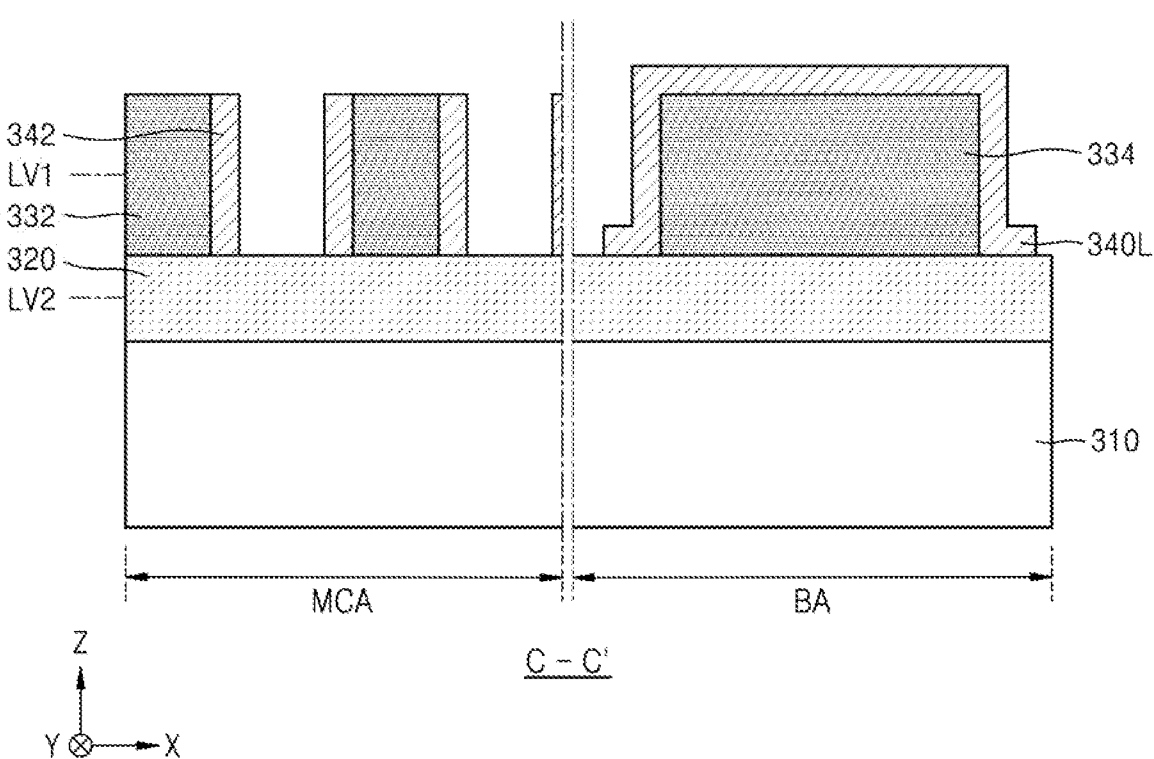

Referring to FIG. 15, a first spacer layer 340L covering the plurality of reference patterns 332 and the align key reference pattern 334 may be formed on the feature layer 320, and a mask pattern covering the align key reference pattern 334 may be formed on the first spacer layer 340L.

Subsequently, a plurality of first spacers 342 may be formed on both sidewalls of each of the plurality of reference patterns 332 by performing an etch-back process on an upper portion of the first spacer layer 340L not covered by the mask pattern. The plurality of first spacers 342 may be formed of a second material, and the second material may include silicon oxide, silicon nitride, or silicon oxynitride.

In an implementation, the first spacer layer 340L covering a top surface and a sidewall of the align key reference pattern 334 may not be removed in the etch-back process and may remain.

Figure 16:
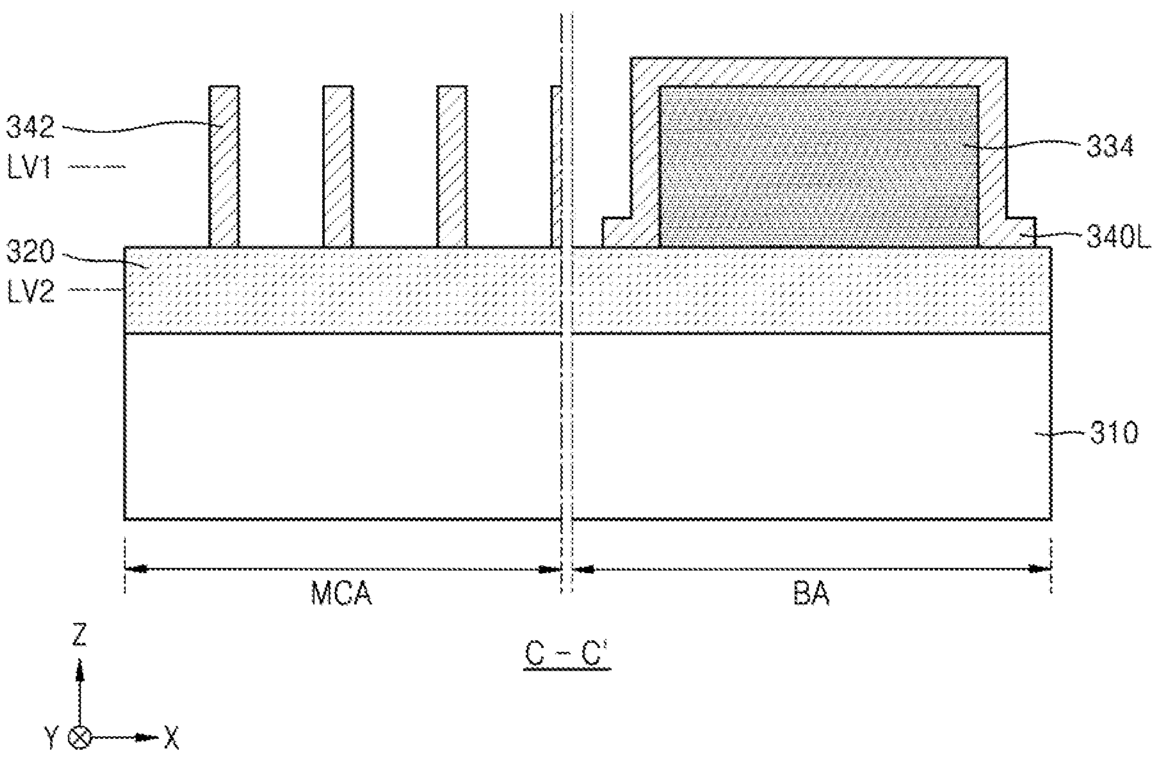

Referring to FIG. 16, the plurality of reference patterns 332 may be removed, and the plurality of first spacers 342 may be formed on the cell array region MCA.

In an implementation, a process of removing the plurality of reference patterns 332 may include an etching process using an etch selectivity, e.g., the first spacer layer 340L may be etched by a very small amount or may be hardly etched and may remain on the boundary region BA, and a top surface of the align key reference pattern 334 may not be exposed.

Figure 17:
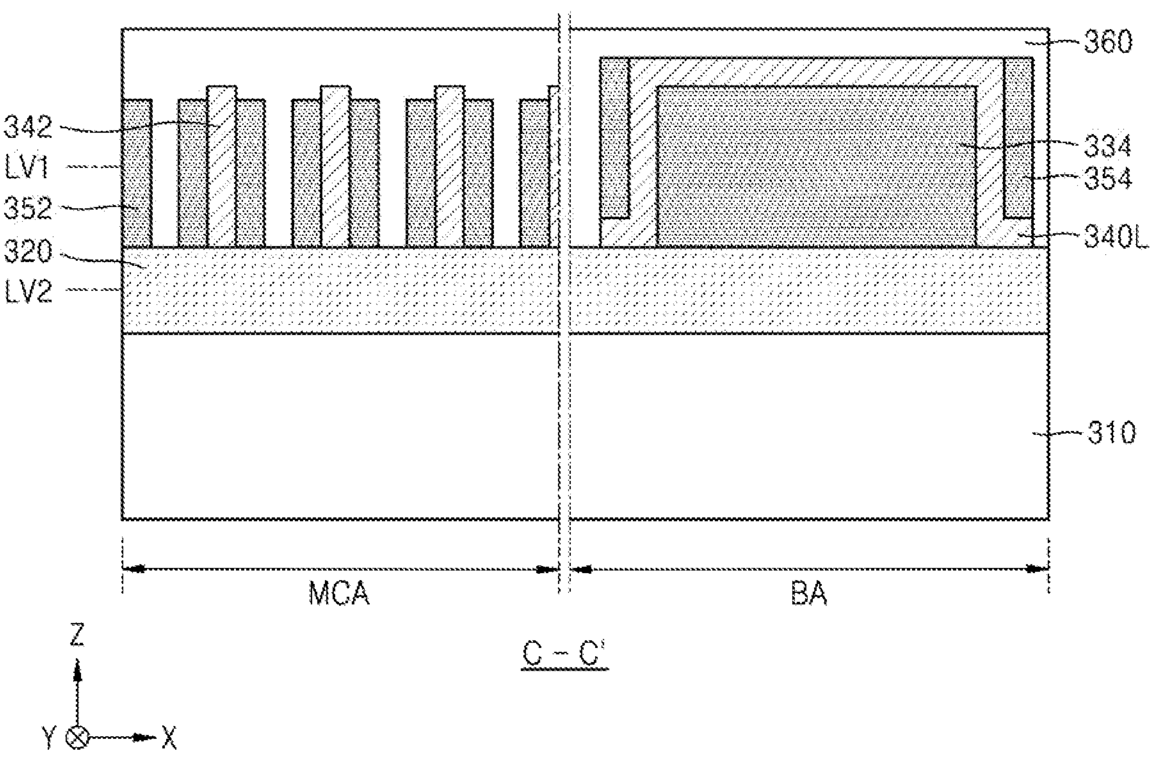

Referring to FIG. 17, a second spacer layer covering the plurality of first spacers 342 and the first spacer layer 340L may be formed on the feature layer 320, and a plurality of second spacers 352 may be formed on both sidewalls of each of the plurality of first spacers 342 by performing an etch-back process on an upper portion of the second spacer layer.

In this case, a portion of the second spacer layer may remain on a sidewall of the align key reference pattern 334 and may be referred to as an edge spacer pattern 354.

In an implementation, the second spacer 352 may be formed of a first material, and the first material may include polysilicon or amorphous silicon. In an implementation, the second spacer 352 may include the same material as the first material included in the plurality of reference patterns 332 and the align key reference pattern 334, or may include a similar or same kind of material having an etch characteristic similar to that of the first material.

Subsequently, a gap-fill insulation layer 360 filling a space between the plurality of second spacers 352 may be formed on the feature layer 320. The gap-fill insulation layer 360 may include a second material, and the second material may include silicon oxide, silicon nitride, silicon oxynitride, or an SOH. In an implementation, the gap-fill insulation layer 360 may include the same material as a material included in the plurality of first spacers 342, or may include the same kind of material having an etch characteristic similar to that of the material. In an implementation, the plurality of first spacers 342 may include silicon oxide, and the gap-fill insulation layer 360 may include silicon oxide. In an implementation, the plurality of first spacers 342 may include silicon oxide, and the gap-fill insulation layer 360 may include an SOH.

In an implementation, a planarization process may be performed on an upper portion of the gap-fill insulation layer 360.

Figure 18:
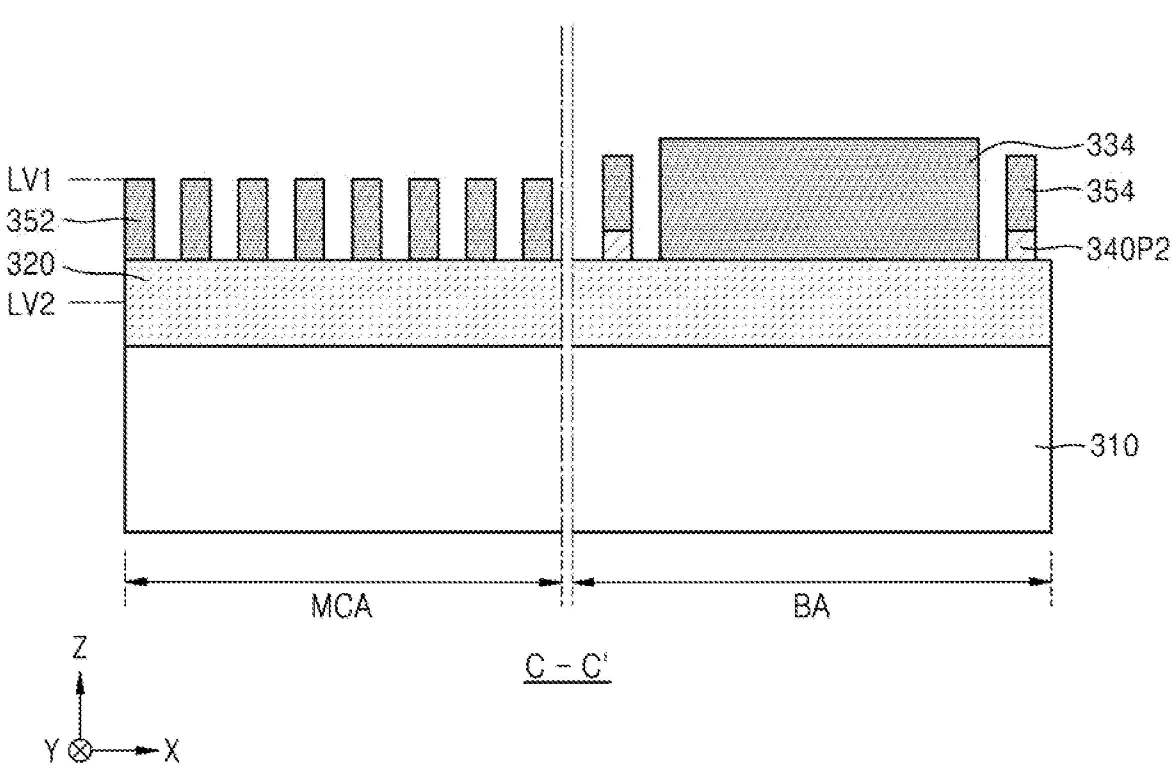

Referring to FIG. 18, the plurality of second spacers 352, the edge spacer pattern 354, and the align key reference pattern 334 may remain on the feature layer 320 by removing the plurality of first spacers 342 and the gap-fill insulation layer 360.

In an implementation, the plurality of first spacers 342 and the gap-fill insulation layer 360 may include the same second material or the same kind of materials having similar etch characteristics, and thus, a process of removing the plurality of first spacers 342 and the gap-fill insulation layer 360 may be performed at an etching step (e.g., single etching step) using the same etchant. In an implementation, the process of removing the plurality of first spacers 342 and the gap-fill insulation layer 360 may be performed under etching conditions having an etch selectivity with respect to the plurality of second spacers 352 and the align key reference pattern 334.

Figure 19A:
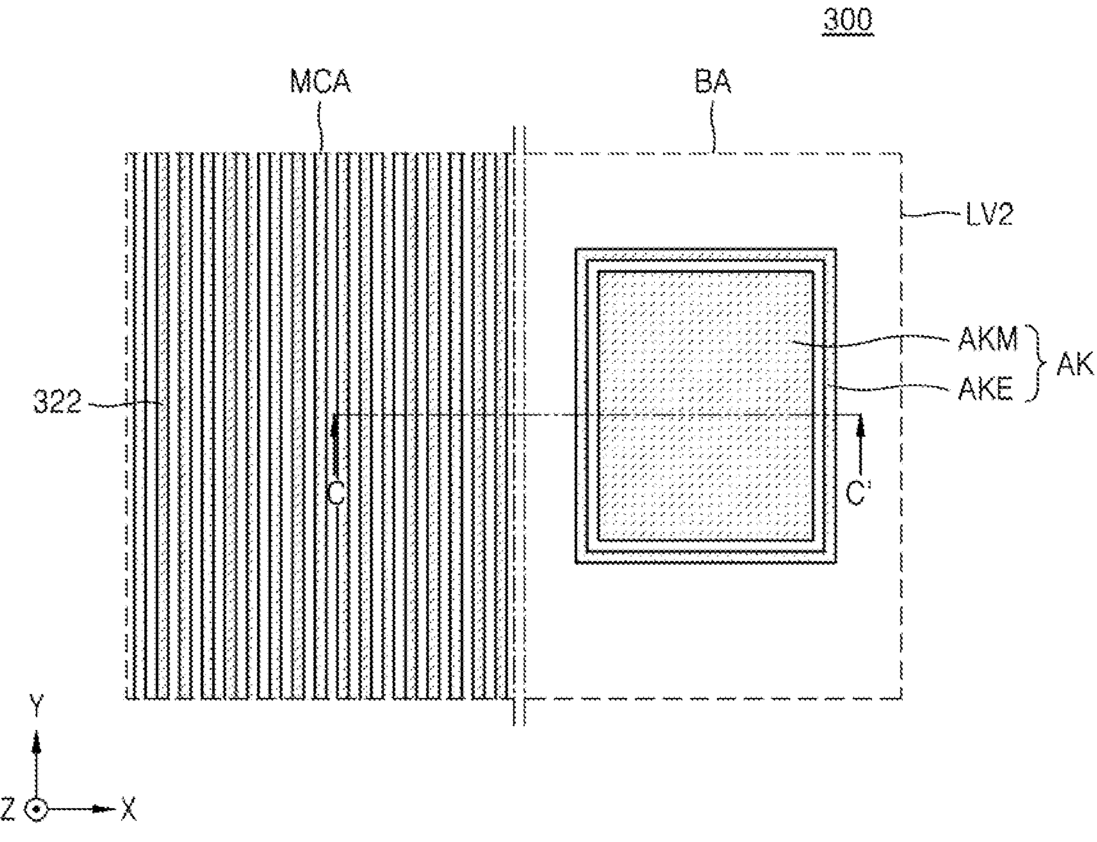
Figure 19B:
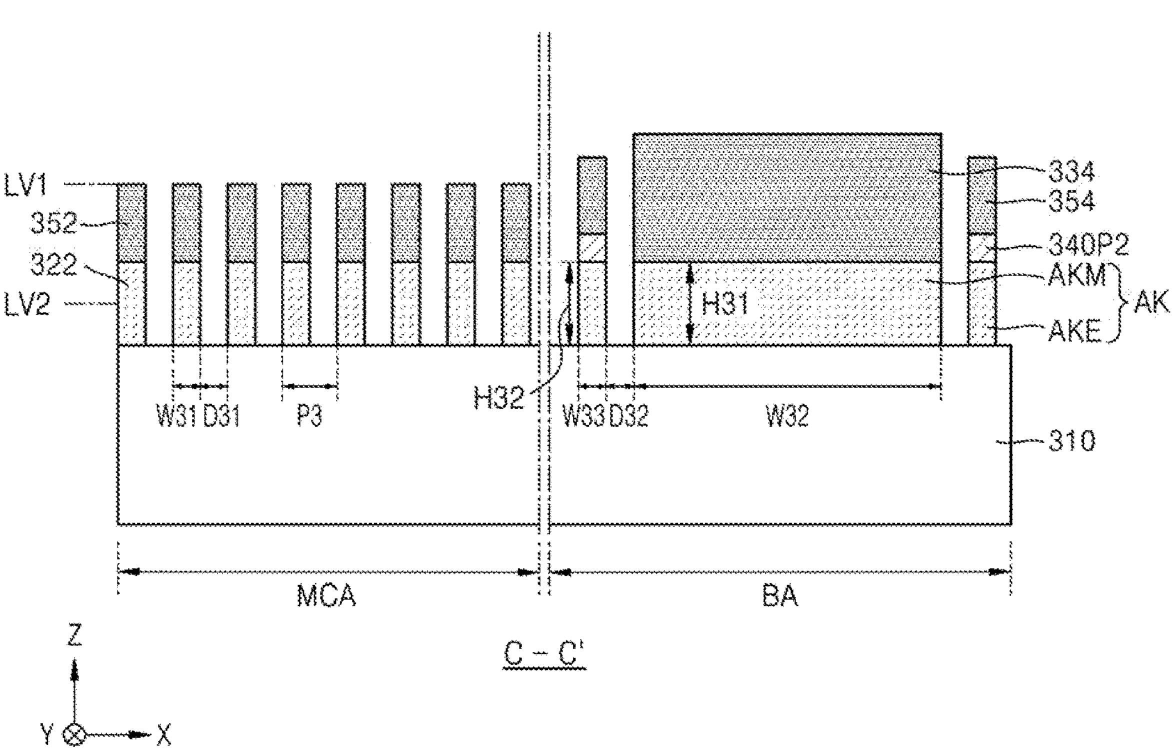

Referring to FIGS. 19A and 19B, a plurality of feature patterns 322 and an align key pattern AK may be formed by etching the feature layer 320 by using the plurality of second spacers 352, the edge spacer pattern 354, and the align key reference pattern 334 as an etch mask.

The plurality of feature patterns 322 may be formed at positions respectively corresponding to the plurality of second spacers 352, and the align key pattern AK may be formed at a position corresponding to the edge spacer pattern 354 and the align key reference pattern 334.

In an implementation, the plurality of feature patterns 322 may each have a first width W31 in the first direction X and may be spaced apart from one another by a first interval D31 in the first direction X. In an implementation, the plurality of feature patterns 322 may be arranged at a first pitch P3, and when a target feature size of each of the plurality of feature patterns 322 is 1F, the first pitch P3 may correspond to 2F. In an implementation, the first width W31 of each of the plurality of feature patterns 322 may correspond to 1F, and the first interval D31 may correspond to 1F.

In an implementation, the align key pattern AK may include a main pattern AKM and an edge pattern AKE. The main pattern AKM may have a second width W32, and the second width W32 may be greater than the first width W31 of each of the plurality of feature patterns 322.

In an implementation, the edge pattern AKE may surround the main pattern AKM in a plan view and may be spaced apart from the main pattern AKM by a second interval D32. In an implementation, the second interval D32 may be the same as the first interval D31. The second interval D32 may correspond to 1F. The edge pattern AKE may have a third width W33, and the third width W33 may be less than the second width W32 and may be equal to the first width W31. In an implementation, the third width W33 may correspond to 1F.

The edge pattern AKE may be formed to have the same height (e.g., in the Z direction) as that of the main pattern AKM at a periphery of the main pattern AKM. In an implementation, the main pattern AKM may have a first height H31, and the edge pattern AKE may have a second height H32 which is the same as the first height H31.

In an implementation, the align key pattern AK may be formed along with the plurality of feature patterns 322 having a fine pitch, and a patterning process performed on the plurality of feature patterns 322 having a fine pitch may be precisely adjusted.

By way of summation and review, patterning technologies such as double patterning technology (DPT) and quadruple patterning technology (QPT) may form a fine pattern that is more reduced in a resolution limitation of a photolithography process.

One or more embodiments may provide a method of manufacturing a semiconductor device by using quadruple patterning technology.

One or more embodiments may provide a method of manufacturing a semiconductor device, in which a fine pattern having a reduced width may be formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
- forming a plurality of reference patterns and a peripheral pattern on a feature layer using a first material such that the peripheral pattern is connected to end portions of the plurality of reference patterns;
- forming a plurality of first spacers on opposite sidewalls of each of the plurality of reference patterns using a second material;
- removing the plurality of reference patterns;
- forming a plurality of second spacers on opposite sidewalls of each of the plurality of first spacers using the first material, wherein the feature layer is exposed between neighboring pairs of first spacers of the plurality of first spacers;
- forming a gap-fill insulation layer to cover the feature layer, the plurality of first spacers, and the plurality of second spacers, the gap-fill insulation layer contacting the feature layer;
- removing the plurality of first spacers and the gap-fill insulation layer so that the plurality of second spacers and the peripheral pattern remain on the feature layer with the feature layer exposed between neighboring pairs of second spacers of the plurality of second spacers; and
- patterning the feature layer using the plurality of second spacers and the peripheral pattern as an etch mask.

2. The method as claimed in claim 1, wherein:
- the first material includes polysilicon or amorphous silicon, and
- the second material includes silicon oxide, silicon nitride, or silicon oxynitride.

3. The method as claimed in claim 1, wherein, in a plan view, the peripheral pattern surrounds the plurality of reference patterns.

4. The method as claimed in claim 1, wherein:
- F is a target feature size,
- the plurality of reference patterns are arranged at a pitch of 8F,
- the plurality of first spacers are arranged at a pitch of 4F, and
- the plurality of second spacers are arranged at a pitch of 2F.

5. The method as claimed in claim 1, wherein forming the plurality of first spacers includes:
- forming a first spacer layer on the feature layer to cover the plurality of reference patterns and the peripheral pattern;
- forming a mask pattern on the first spacer layer such that the mask pattern does not cover a first portion of the first spacer layer on the plurality of reference patterns and does cover a second portion of the first spacer layer on the peripheral pattern; and
- removing some portions of the first portion of the first spacer layer from a top surface of each of the plurality of reference patterns such that the plurality of first spacers remain on both sidewalls of the plurality of reference patterns.

6. The method as claimed in claim 5, wherein, in the removing of the plurality of reference patterns, the second portion of the first spacer layer remains and covers a top surface of the peripheral pattern.

7. The method as claimed in claim 5, further comprising performing a planarization process on an upper portion of the gap-fill insulation layer such that a difference between a top level of the gap-fill insulation layer on the second portion of the first spacer layer and a top level of the gap-fill insulation layer on the plurality of second spacers is decreased, after forming the gap-fill insulation layer.

8. The method as claimed in claim 5, wherein the gap-fill insulation layer includes silicon oxide, silicon nitride, silicon oxynitride, or a spin-on hardmask (SOH).

9. A method of manufacturing a semiconductor device, the method comprising:
- forming a plurality of reference patterns and a peripheral pattern on a feature layer such that the peripheral pattern is connected to end portions of the plurality of reference patterns;
- forming a plurality of first spacers on both sidewalls of each of the plurality of reference patterns;
- removing the plurality of reference patterns;
- forming a plurality of second spacers on opposite sidewalls of each of the plurality of first spacers;
- forming a gap-fill insulation layer on the feature layer such that the gap-fill insulation layer fills a space between the plurality of second spacers and contacts the feature layer;
- removing the gap-fill insulation layer and the plurality of first spacers such that the plurality of second spacers and the peripheral pattern remain on the feature layer; and
- patterning the feature layer using the plurality of second spacers and the peripheral pattern as an etch mask.

10. The method as claimed in claim 9, wherein:

the plurality of reference patterns, the peripheral pattern, and the plurality of second spacers include polysilicon or amorphous silicon, and the plurality of first spacers and the gap-fill insulation layer include silicon oxide, silicon nitride, or silicon oxynitride.

11. The method as claimed in claim 9, wherein forming the plurality of first spacers includes:

forming a first spacer layer on the feature layer to cover the plurality of reference patterns and the peripheral pattern;

forming a mask pattern on the first spacer layer such that the mask pattern does not cover a first portion of the first spacer layer on the plurality of reference patterns and does cover a second portion of the first spacer layer on the peripheral pattern; and removing some portions of the first portion of the first spacer layer from a top surface of each of the plurality of reference patterns such that the plurality of first spacers remain on the opposite sidewalls of the plurality of reference patterns.

12. The method as claimed in claim 11, wherein, in the removing of the plurality of reference patterns, the second portion of the first spacer layer remains and covers a top surface of the peripheral pattern.

13. The method as claimed in claim 11, further comprising performing a planarization process on an upper portion of the gap-fill insulation layer such that a difference between a top level of the gap-fill insulation layer on the second portion of the first spacer layer and a top level of the gap-fill insulation layer on the plurality of second spacers is decreased, after forming the gap-fill insulation layer.

14. The method as claimed in claim 9, wherein, in a plan view, the peripheral pattern surrounds the plurality of reference patterns.

15. The method as claimed in claim 9, wherein:

F is a target feature size, the plurality of reference patterns are arranged at a pitch of 8F, the plurality of first spacers are arranged at a pitch of 4F, and the plurality of second spacers are arranged at a pitch of 2F.

16. A method of manufacturing a semiconductor device, the method comprising:

providing a substrate including a cell array region and a boundary region;

forming a feature layer on the substrate;

forming a plurality of reference patterns and a peripheral pattern on the feature layer using a first material, the plurality of reference patterns being on the cell array region, and the peripheral pattern being connected to end portions of the plurality of reference patterns and on the boundary region;

forming a plurality of first spacers on opposite sidewalls of each of the plurality of reference patterns using a second material;

removing the plurality of reference patterns;

forming a plurality of second spacers on opposite sidewalls of each of the plurality of first spacers by using the first material, wherein the feature layer is exposed between neighboring pairs of first spacers of the plurality of first spacers;

forming a gap-fill insulation layer to cover the feature layer, the plurality of first spacers, and the plurality of second spacers, the gap-fill insulation layer contacting the feature layer;

removing the plurality of first spacers and the gap-fill insulation layer such that the plurality of second spacers and the peripheral pattern remain on the feature layer with the feature layer exposed between neighboring pairs of second spacers of the plurality of second spacers;

patterning the feature layer using the plurality of second spacers and the peripheral pattern as an etch mask; and removing a portion of the substrate using the feature layer as an etch mask to form a device isolation trench.

17. The method as claimed in claim 16, wherein:

forming the plurality of first spacers includes:

forming a first spacer layer on the feature layer to cover the plurality of reference patterns and the peripheral pattern;

forming a mask pattern on the first spacer layer such that the mask pattern does not cover a first portion of the first spacer layer on the plurality of reference patterns and does cover a second portion of the first spacer layer on the peripheral pattern; and removing some portions of the first portion of the first spacer layer from a top surface of each of the plurality of reference patterns such that the plurality of first spacers remain on both sidewalls of the plurality of reference patterns, and in the removing of the plurality of reference patterns from the feature layer, the second portion of the first spacer layer remains and covers a top surface of the peripheral pattern.

18. The method as claimed in claim 17, further comprising performing a planarization process on an upper portion of the gap-fill insulation layer such that a difference between a top level of the gap-fill insulation layer on the second portion of the first spacer layer and a top level of the gap-fill insulation layer on the plurality of second spacers is decreased, after forming the gap-fill insulation layer.

* * * * *